(12) United States Patent
Lee et al.

(10) Patent No.: US 11,950,438 B2
(45) Date of Patent: Apr. 2, 2024

(54) INORGANIC LIGHT EMITTING DIODE AND INORGANIC LIGHT EMITTING DEVICE INCLUDING THE SAME

(71) Applicant: LG Display Co., Ltd., Seoul (KR)

(72) Inventors: Tae-Yang Lee, Paju-si (KR); Byung-Geol Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 666 days.

(21) Appl. No.: 17/117,334

(22) Filed: Dec. 10, 2020

(65) Prior Publication Data

US 2021/0184146 A1 Jun. 17, 2021

(30) Foreign Application Priority Data

Dec. 17, 2019 (KR) .................. 10-2019-0168691
Sep. 17, 2020 (KR) .................. 10-2020-0119844

(51) Int. Cl.
| | |
|---|---|
| *H10K 50/115* | (2023.01) |
| *C09K 11/02* | (2006.01) |
| *C09K 11/56* | (2006.01) |
| *C09K 11/70* | (2006.01) |
| *C09K 11/88* | (2006.01) |
| *H10K 85/40* | (2023.01) |
| *H10K 102/00* | (2023.01) |

(52) U.S. Cl.
CPC .......... *H10K 50/115* (2023.02); *C09K 11/025* (2013.01); *C09K 11/565* (2013.01); *C09K 11/70* (2013.01); *C09K 11/883* (2013.01); *H10K 85/40* (2023.02); *H10K 2102/351* (2023.02)

(58) Field of Classification Search
None
See application file for complete search history.

(56) References Cited

U.S. PATENT DOCUMENTS

| | | | |
|---|---|---|---|
| 2015/0034875 A1 | 2/2015 | Kwon et al. | |
| 2018/0083158 A1* | 3/2018 | Jang | G02F 1/0045 |
| 2019/0086733 A1* | 3/2019 | Min | G02B 6/0011 |
| 2019/0115507 A1* | 4/2019 | Kim | H10K 50/82 |
| 2019/0115550 A1* | 4/2019 | Kim | H10K 50/115 |
| 2019/0180070 A1* | 6/2019 | Chen | G02F 1/133603 |
| 2019/0288168 A1* | 9/2019 | Kong | H01L 33/486 |

FOREIGN PATENT DOCUMENTS

KR 10-2013-0089295 A 8/2013

* cited by examiner

*Primary Examiner* — Michelle Mandala
(74) *Attorney, Agent, or Firm* — Birch, Stewart, Kolasch & Birch, LLP

(57) ABSTRACT

The present disclosure relates to an inorganic light emitting diode (LED) in which an emitting material layer (EML) includes inorganic luminescent particles dispersed in a siloxane matrix, wherein the siloxane matrix has a thickness equal to or less than a thickness of a layer of the inorganic luminescent particles, and an inorganic light emitting device including the inorganic LED. The siloxane matrix allows surface defects of the inorganic luminescent particles to be minimized and to prevent injections of holes and electrons from being delayed. The inorganic LED and the inorganic light emitting device lower their driving voltages and improve their luminous efficiency.

20 Claims, 16 Drawing Sheets

$T_2 \leq T_1$

INORGANIC LIGHT EMITTING DIODE AND INORGANIC LIGHT EMITTING DEVICE INCLUDING THE SAME

CROSS REFERENCE TO RELATED APPLICATION

This application claims the priority benefit under 35 U.S.C. § 119(a) of Korean Patent Application No. 10-2019-0168691, filed in the Republic of Korea on Dec. 17, 2019 and No. 10-2020-0119844, filed in the Republic of Korea on Sep. 17, 2020, the entire contents of all these applications are incorporated herein by reference in its entirety into the present application.

BACKGROUND

Technical Field

The present disclosure relates to a light emitting diode, and more specifically, to an inorganic light emitting diode enhances its stability and luminous efficiency and an inorganic light emitting device including the diode.

Discussion of the Related Art

As electronic and information technologies progress rapidly, a field of displays for processing and displaying a large quantity of information has been developed rapidly. Accordingly, various flat panel display devices have been widely used. Among the flat panel display devices, an organic light emitting diode (OLED) has come into spotlight. Since the OLED can be formed even on a flexible transparent substrate and has relatively lower power consumption, the OLED display device has attracted a lot of attention as a next-generation display device replacing LCD. However, in case of increasing current densities or raising driving voltages in the OLED for improving luminance in OLED display device, the luminous lifetime of the OLED become shorter owing to thermal degradation and deteriorations of organic materials in the OLED.

Recently, a display device using inorganic luminescent particles such as quantum dot (QD) or quantum rod (QR) has been developed. QD or QR is an inorganic luminescent particle that emits light as unstable stated excitons shift from its conduction band to its valance band. QD or QR has large extinction coefficient, high quantum yield among inorganic particles and generates strong fluorescence. Besides, since QD or QR has different luminescence wavelengths as its sizes, it is possible to obtain light within the whole visible light spectra so as to implement various colors by adjusting sizes of QD or QR.

When the inorganic luminescent particles such as QD are produced or are introduced into a light emitting diode, the inorganic luminescent particles are exposed to external environment as organic ligands bound to the surface of the particles are detached or separated from the particles. As the inorganic luminescent particles, which is very vulnerable to external environment such as moisture or oxygen, was exposed to external environments, the luminous efficiency of the particles is deteriorated. In addition, as voids are formed in an emitting material layer consisting of the inorganic luminescent particles and surface defects such as vacancy on a surface of the inorganic luminescent particles are caused, an exciton generation efficiency of the inorganic luminescent particles are deteriorate.

SUMMARY

Accordingly, embodiments of the present disclosure are directed to an inorganic light emitting diode and an inorganic light emitting device having the diode that substantially obviates one or more of the problems due to the limitations and disadvantages of the related art.

An object of the present disclosure is to provide an inorganic light emitting diode that minimizes surface defects on inorganic luminescent particles or voids to improve a stability of the inorganic luminescent particles and an inorganic light emitting device including the diode.

Another object of the present disclosure is to provide an inorganic light emitting diode that reduces its driving voltage and improves its luminous efficiency and an inorganic light emitting device including the diode.

Additional features and aspects will be set forth in the description that follows, and in part will be apparent from the description, or can be learned by practice of the inventive concepts provided herein. Other features and aspects of the inventive concept can be realized and attained by the structure particularly pointed out in the written description, or derivable therefrom, and the claims hereof as well as the appended drawings.

To achieve these and other aspects of the inventive concept, as embodied and broadly described, the present disclosure provides an inorganic light emitting diode, comprises a first electrode; a second electrode facing the first electrode; and an emitting material layer disposed between the first and second electrodes, wherein the emitting material layer comprises an inorganic luminescent particle dispersed in a siloxane matrix, and wherein the siloxane matrix has a thickness equal to or less than a thickness of a layer of the inorganic luminescent particle.

As an example, the siloxane matrix can have the thickness of at least equal to or more than about a tenth, preferably about a fourth, and more preferably about a third of the thickness of the layer of the inorganic luminescent particle.

In one exemplary aspect, the inorganic luminescent particle and the siloxane matrix in the emitting material layer can be mixed with a volume ratio between about 1:0.01 and about 1:4, preferably between about 1:0.05 and about 1:2.

The siloxane matrix can comprise an orthosilicate moiety. For example, the orthosilicate moiety can comprise a tetramethyl orthosilicate moiety, a tetraethyl orthosilicate moiety, a tetrapropyl orthosilicate, a tetrabutyl orthosilicate and a tetrakis(2-ethylhexyl) orthosilicate moiety.

In another exemplary aspect, the siloxane matrix can comprise a silsesquionxne.

The inorganic luminescent particle can include at least one of a quantum dot (QD) and a quantum rod (QR).

In another aspect, the present disclosure an inorganic light emitting device that comprises a substrate and the inorganic light emitting diode over the substrate, as described above.

It is to be understood that both the foregoing general description and the following detailed description are examples and are explanatory and are intended to provide further explanation of the inventive concepts as claimed.

BRIEF DESCRIPTION OF THE DRAWINGS

The accompanying drawings, which are included to provide a further understanding of the disclosure, are incorporated in and constitute a part of this application, illustrate embodiments of the disclosure and together with the description serve to explain principles of the disclosure.

FIG. 13A illustrates a line-profile of the inorganic LED, FIG. 13B is a graph illustrating atomic % of zinc, which is one element of a quantum dot, by STEM-EDS, and FIG. 13C is a graph illustrating atomic % of silicon, which is one element of a siloxane matrix, by STEM-EDS.

FIG. 14A illustrates a line-profile of the inorganic LED, FIG. 14B is a graph illustrating atomic % of zinc, which is one element of a quantum dot, by STEM-EDS, and FIG. 14C is a graph illustrating atomic % of silicon, which is one element of a siloxane matrix, by STEM-EDS.

FIG. 15A illustrates a line-profile of the inorganic LED, FIG. 15B is a graph illustrating atomic % of zinc, which is one element of a quantum dot, by STEM-EDS, and FIG. 15C is a graph illustrating atomic % of silicon, which is one element of a siloxane matrix, by STEM-EDS.

DETAILED DESCRIPTION OF THE EMBODIMENTS

Reference will now be made in detail to aspects of the disclosure, examples of which are illustrated in the accompanying drawing.

[Inorganic Light Emitting Device and Inorganic LED]

Figure 1:
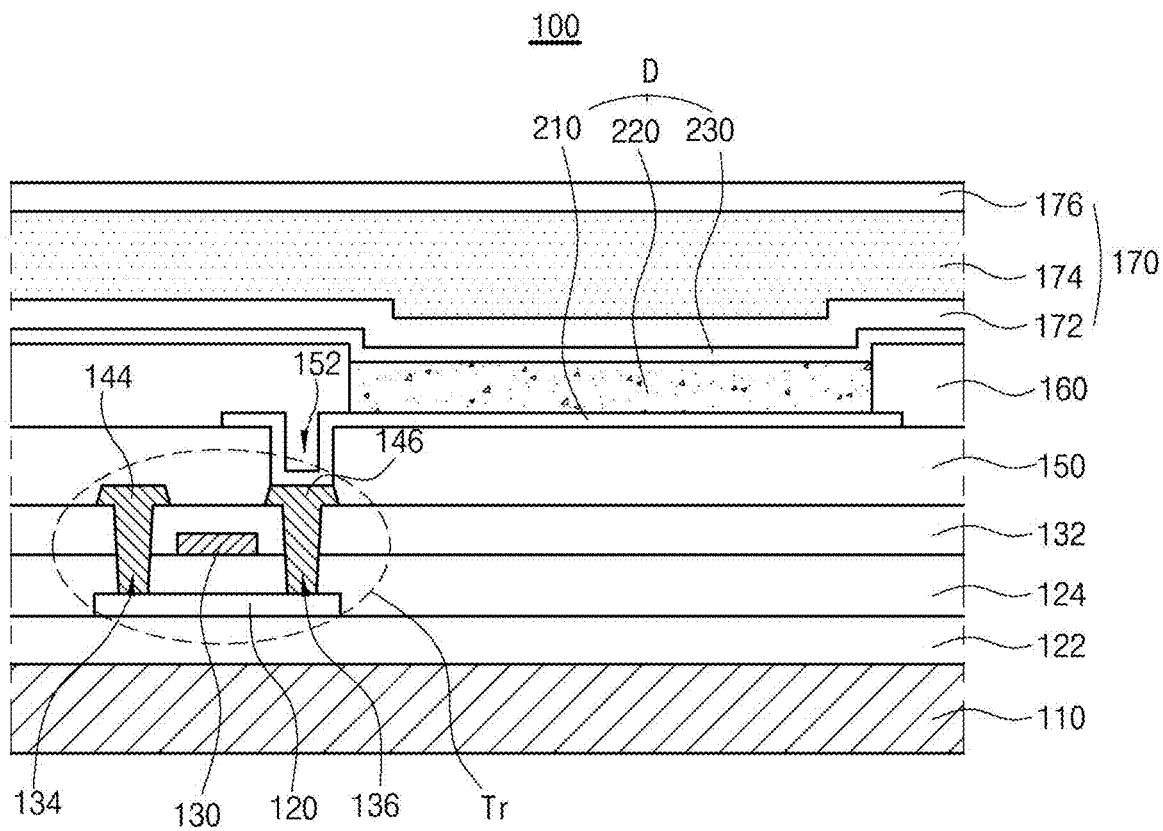
FIG. 1 is a schematic cross-sectional view illustrating an inorganic light emitting display device in accordance with an exemplary aspect of the present disclosure.

The present disclosure relates to an inorganic light emitting diode (LED) in which an EML includes inorganic luminescent particles dispersed in a siloxane matrix of which thickness are designed to be equal to or less than a thickness of a layer of an inorganic luminescent layer, thus the inorganic LED lowers its driving voltage and improves its luminous efficiency, and an inorganic light emitting device including the inorganic LED. The inorganic LED can be applied to an inorganic light emitting device such as an inorganic light emitting display device and an inorganic light emitting illumination device. FIG. 1 is a schematic cross-sectional view illustrating an inorganic light emitting display device in accordance with an exemplary aspect of the present disclosure. All the components of the inorganic light emitting display/illumination device according to all embodiments of the present disclosure are operatively coupled and configured.

As illustrated in FIG. 1, an inorganic light emitting display device 100 includes a substrate 110, a thin film transistor Tr over the substrate 110 and an inorganic light emitting diode (LED) D connected to the thin film transistor Tr.

The substrate 112 can include, but is not limited to, glass, thin flexible material and/or polymer plastics. For example, the flexible material can be selected from the group, but is not limited to, polyimide (PI), polyethersulfone (PES), polyethylene naphthalate (PEN), polyethylene terephthalate (PET), polycarbonate (PC) and combination thereof. The substrate 110, over which the thin film transistor Tr and the inorganic LED D are arranged, form an array substrate.

A buffer layer 122 can be disposed over the substrate 110, and the thin film transistor Tr is disposed over the buffer layer 122. The buffer layer 122 can be omitted.

A semiconductor layer 120 is disposed over the buffer layer 122. In one exemplary aspect, the semiconductor layer 120 can include, but is not limited to, oxide semiconductor materials. In this case, a light-shied pattern can be disposed under the semiconductor layer 120, and the light-shield pattern can prevent light from being incident toward the semiconductor layer 120, and thereby preventing the semiconductor layer 120 from being deteriorated by the light. Alternatively, the semiconductor layer 120 can include polycrystalline silicon. In this case, opposite edges of the semiconductor layer 120 can be doped with impurities.

A gate insulating layer 124 made of an insulating material is disposed on the semiconductor layer 120. The gate insulating layer 124 can include, but is not limited to, an inorganic insulating material such as silicon oxide ($SiO_x$) or silicon nitride ($SiN_x$).

A gate electrode 130 made of a conductive material such as a metal is disposed over the gate insulating layer 124 so as to correspond to a center of the semiconductor layer 120. While the gate insulating layer 124 is disposed over a whole area of the substrate 110 in FIG. 1, the gate insulating layer 124 can be patterned identically as the gate electrode 130.

An interlayer insulating layer 132 made of an insulating material is disposed on the gate electrode 130 with covering over an entire surface of the substrate 110. The interlayer insulating layer 132 can include, but is not limited to, an inorganic insulating material such as silicon oxide ($SiO_x$) or silicon nitride ($SiN_x$), or an organic insulating material such as benzocyclobutene or photo-acryl.

The interlayer insulating layer 132 has first and second semiconductor layer contact holes 134 and 136 that expose both sides of the semiconductor layer 120. The first and second semiconductor layer contact holes 134 and 136 are disposed over both sides of the gate electrode 130 with spacing apart from the gate electrode 130. The first and second semiconductor layer contact holes 134 and 136 are formed within the gate insulating layer 124 in FIG. 1. Alternatively, the first and second semiconductor layer contact holes 134 and 136 are formed only within the interlayer insulating layer 132 when the gate insulating layer 124 is patterned identically as the gate electrode 130.

A source electrode 144 and a drain electrode 146, each of which includes a conductive material such as a metal, are disposed on the interlayer insulating layer 132. The source electrode 144 and the drain electrode 146 are spaced apart from each other with respect to the gate electrode 130, and contact both sides of the semiconductor layer 120 through the first and second semiconductor layer contact holes 134 and 136, respectively.

The semiconductor layer 120, the gate electrode 130, the source electrode 144 and the drain electrode 146 constitute the thin film transistor Tr, which acts as a driving element. The thin film transistor Tr in FIG. 1 has a coplanar structure in which the gate electrode 130, the source electrode 144 and the drain electrode 146 are disposed over the semiconductor layer 120. Alternatively, the thin film transistor Tr can have an inverted staggered structure in which a gate electrode is disposed under a semiconductor layer and source and drain electrodes are disposed over the semiconductor layer. In this case, the semiconductor layer can include, but is not limited to, amorphous silicon.

A gate line and a data line, which cross each other to define a pixel region, and a switching element, which is connected to the gate line and the data line, can be further formed in the pixel region. The switching element is connected to the thin film transistor Tr, which is a driving element. In addition, a power line is spaced apart in parallel from the gate line or the data line, and the thin film transistor Tr can further includes a storage capacitor configured to constantly keep a voltage of the gate electrode for one frame.

Moreover, the inorganic light emitting display device 100 can include a color filter layer that comprises dyes or pigments for transmitting specific wavelength light of light emitted from the inorganic LED D. For example, the color filter layer can transmit light of specific wavelength such as red (R), green (G), blue (B) and/or white (W). Each of red, green, and blue color filter layers can be formed separately in each pixel region. In this case, the inorganic light emitting display device 100 can implement full-color through the color filter.

For example, when the inorganic light emitting display device 100 is a bottom-emission type, the color filter layer can be disposed on the interlayer insulating layer 132 with corresponding to the inorganic LED D. Alternatively, when the inorganic light emitting display device 100 is a top-emission type, the color filter layer can be disposed over the inorganic LED D, that is, a second electrode 230.

In addition, the inorganic light emitting display device 100 can further comprise a color conversion layer which transforms specific wavelength light among the light emitted from the inorganic LED D. The color conversion layer can comprise an inorganic luminescent material such as a quantum dot and/or a quantum rod. For example, the color conversion layer can be disposed over the inorganic LED D or under the inorganic LED D.

A passivation layer 150 is disposed on the source and drain electrodes 144 and 146 over the whole substrate 110. The passivation layer 150 has a flat top surface and a drain contact hole 152 that exposes the drain electrode 146 of the thin film transistor Tr. While the drain contact hole 152 is disposed on the second semiconductor layer contact hole 136, it can be spaced apart from the second semiconductor layer contact hole 136.

The inorganic LED D includes a first electrode 210 that is disposed on the passivation layer 150 and connected to the drain electrode 146 of the thin film transistor Tr. The inorganic LED D further includes an emissive layer 220 and a second electrode 230 each of which is disposed sequentially on the first electrode 210.

The first electrode 210 is disposed in each pixel region. The first electrode 210 can be an anode and include a conductive material having relatively high work function value. For example, the first electrode 210 can include, but is not limited to, a doped or undoped metal oxide such as indium-tin-oxide (ITO), indium-zinc-oxide (IZO), indium-tin-zinc oxide (ITZO), indium-copper-oxide (ICO), tin oxide ($SnO_2$), indium oxide ($In_2O_3$), cadmium:zinc oxide (Cd:ZnO), fluorine:tin oxide ($F:SnO_2$), indium:tin oxide ($In:SnO_2$), gallium:tin oxide ($Ga:SnO_2$) or aluminum:zinc oxide (Al:ZnO; AZO). Optionally, the first electrode 210 can include a metal or nonmetal material such as nickel (Ni), platinum (Pt), gold (Au), silver (Ag), iridium (Ir) or a carbon nanotube (CNT), other than the above-described metal oxide.

In one exemplary aspect, when the inorganic light emitting display device 100 is a bottom-emission type, the first electrode 210 can have a single-layered structure of transparent conductive oxide. Alternatively, when the inorganic light emitting display device 100 is a top-emission type, a reflective electrode or a reflective layer can be disposed under the first electrode 210. For example, the reflective electrode or the reflective layer can comprise, but is not limited to, silver (Ag) or aluminum-palladium-copper (APC) alloy. In the inorganic LED D of a top-emission type, the first electrode 210 can have a triple-layered structure of ITO/Ag/ITO or ITO/APC/ITO.

In addition, a bank layer 160 is disposed on the passivation layer 150 in order to cover edges of the first electrode 210. The bank layer 160 exposes a center of the first electrode 210.

An emissive layer 220 is disposed on the first electrode 210. In one exemplary aspect, the emissive layer 220 can have a single-layered structure of an emitting material layer (EML) 240 (see, FIG. 2). Alternatively, the emissive layer 220 can have a multiple-layered structure of an EML 240, a first charge transfer layer 250, a second charge transfer layer 270, a CCL 260, and optionally at least one of an electron blocking layer (EBL) 265 and a hole blocking layer (HBL) 275 (see, FIGS. 2, 4 and 5). In one exemplary aspect, the emissive layer 220 can have one emitting part. Alternatively, the emissive layer 220 can have multiple emitting parts to form a tandem structure.

The second electrode 230 is disposed over the substrate 110 above which the emissive layer 220 is disposed. The second electrode 230 can be disposed over a whole display area, can include a conductive material having a relatively low work function value compared to the first electrode 210, and can be a cathode. For example, the second electrode 230 can include, but is not limited to, Ca, Ba, Ca/Al, LiF/Ca, LiF/Al, BaF$_2$/Al, CsF/Al, CaCO$_3$/Al, BaF$_2$/Ca/Al, Al, Mg, Au:Mg or Ag:Mg. When the inorganic light emitting display device 100 is a top-emission type, the second electrode 230 is thin so as to have light-transmissive (semi-transmissive) property.

In addition, an encapsulation film 170 can be disposed over the second electrode 220 in order to prevent outer moisture from penetrating into the inorganic LED D. The encapsulation film 170 can have, but is not limited to, a laminated structure of a first inorganic insulating film 172, an organic insulating film 174 and a second inorganic insulating film 176.

Moreover, can the inorganic light emitting display device 100 can have a polarizer in order to decrease external light reflection. For example, the polarizer can be a circular polarizer. When the organic light emitting display device 100 is a bottom-emission type, the polarizer can be disposed under the substrate 100. Alternatively, when the organic light emitting display device 100 is a top-emission type, the polarizer can be disposed over the encapsulation film 170. In addition, a cover window can be attached to the encapsulation film 170 or the polarizer. In this case, the substrate 110 and the cover window can have a flexible property, thus the light emitting display device 100 can be a flexible display device.

Figure 2:
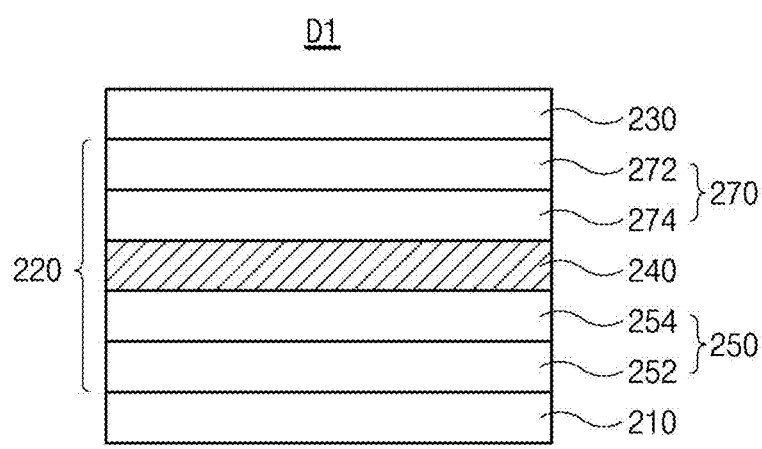
FIG. 2 is a schematic cross-sectional view illustrating an inorganic light emitting diode (LED) in accordance with one exemplary aspect of the present disclosure.

FIG. 2 is a cross-sectional view illustrating an inorganic light emitting diode (LED) in accordance with one exemplary aspect of the present disclosure. As illustrated in FIG. 2, the inorganic LED D1 comprises a first electrode 210, a second electrode 230 facing the first electrode 210 and an emissive layer 220 disposed between the first and second electrodes 210 and 230. The inorganic light emitting display device 100 (FIG. 1) can include a red pixel region, a green pixel region and a blue pixel region, and the inorganic LED D1 can be disposed in any pixel region of the red, green and blue pixel regions. The emissive layer 220 having single emitting part comprises an EML 240 disposed between the first and second electrodes 210 and 230. Also, the emissive layer 220 can at least one of a first charge transfer layer (CTL1) 250 disposed between the first electrode and the EML 240, a second charge transfer layer (CTL2) 270 disposed between the EML 240.

In this aspect, the first electrode 210 can be an anode such as a hole injection electrode. The first electrode 210 can be located over a substrate 110 (see, FIG. 1) that can be a glass or a polymer. As an example, the first electrode 210 can include, but is not limited to, a doped or undoped metal oxide such as ITO, IZO, ITZO, ICO, SnO$_2$, In$_2$O$_3$, Cd:ZnO, F:SnO$_2$, In: SnO$_2$, Ga:SnO$_2$ and AZO. Optionally, the first electrode 210 can include a metal or nonmetal material such as Ni, Pt, Au, Ag, Ir and CNT, other than the above-described metal oxide.

The second electrode 230 can be a cathode such as an electron injection electrode. As an example, the second electrode 230 can include, but is not limited to, Ca, Ba, Ca/Al, LiF/Ca, LiF/Al, BaF$_2$/Al, CsF/Al, CaCO$_3$/Al, BaF$_2$/Ca/Al, Al, Mg, Au:Mg or Ag:Mg. As an example, each of the first electrode 210 and the second electrode 230 can have a thickness of, but is not limited to, about 5 to about 300 nm, preferably about 10 nm to about 200 nm.

In one exemplary aspect, when the inorganic LED D1 is a bottom emission-type LED, the first electrode 210 can include, but is not limited to, a transparent conductive metal oxide such as ITO, IZO, ITZO or AZO, and the second electrode 230 can include, but is not limited to, Ca, Ba, Ca/Al, LiF/Ca, LiF/Al, BaF$_2$/Al, Al, Mg, or an Ag:Mg alloy.

The EML 240 can include inorganic luminescent particles 300 (see, FIG. 3) and a siloxane matrix 400 in which the inorganic luminescent particles 300 are dispersed. As an example, the inorganic luminescent particles 300 can include quantum dots (QDs) or quantum rods (QRs). QDs or QRs are inorganic luminescent particles each of which emits light as unstable charge excitons shifts from the conduction band energy level to the valance band (VB) energy level. These inorganic luminescent particles 300 have very large extinction coefficient, high quantum yield among inorganic particles and generates strong fluorescence. In addition, these inorganic luminescent particles 300 emit at different luminescence wavelengths as its size, and it is possible to emit lights within the whole visible light spectra so as to implement various colors by adjusting sizes of these inorganic luminescent particles 300. When these inorganic luminescent particles 300 such as QDs and/or QRs are used as a luminescence material in the EML 240, it is possible to enhance color purity in individual pixel region and to realize White (W) light consisting of red (R), green (G) and blue (B) light having high color purity.

In one exemplary aspect, the inorganic luminescent particles 300 (e.g., QDs or QRs) can have a single-layered structure. In another exemplary aspect, the inorganic luminescent particles 300 (e.g., QDs or QRs) can have a multiple-layered heterologous structure, i.e. core 310/shell 320 structures, and can further comprise plural ligands 330 bound to a surface of the shell 320 (see, FIG. 3). Each of the core 310 and the shell 320 can have a single layer or multiple layers, respectively. The reactivity of precursors forming the core 310 and/or shell 320, injection rates of the precursors into a reaction vessel, reaction temperature and kinds of ligands 330 bonded to the outer surface of those inorganic luminescent particles 300 such as QDs or QRs can have affects upon the growth degrees, crystal structures of those inorganic luminescent particles 300. As a result, it is possible to emit lights of various luminescent wavelength ranges, as the energy level bandgap of those inorganic luminescent particles 300 are adjusted.

In one exemplary aspect, the inorganic luminescent particles 300 (e.g., QDs and/or QRs) can have a type I core/shell structure where an energy level bandgap of the core 310 is within an energy level bandgap of the shell 320. In case of using the type I core/shell structure, electrons and holes are transferred to the core 310 and recombined in the core 310. Since the core 310 emits light from exciton energies, it is possible to adjust luminance wavelengths by adjusting sizes of the core 310.

In another exemplary aspect, the inorganic luminescent particles 300 (e.g., QDs and/or QRs) can have type II core/shell structure where the energy level bandgap of the core 310 and the shell 320 are staggered and electrons and holes are transferred to opposite directions among the core 310 and the shell 320. In case of using the type II core/shell structure, it is possible to adjust luminescence wavelengths as the thickness and the energy bandgap locations of the shell 320.

In still another exemplary aspect, the inorganic luminescent particles 300 (e.g., QDs and/or QRs) can have reverse type I core/shell structure where the energy level bandgap of the core 310 is wider than the energy level bandgap of the shell 320. In case of using the reverse type I core/shell structure, it is possible to adjust luminescence wavelengths as thickness of the shell 320.

As an example, when the inorganic luminescent particle 300 (e.g., QDs and/or QRs) has a type-I core/shell structure, the core 310 is a region where luminescence substantially occurs, and a luminescence wavelength of the inorganic luminescent particle 300 is determined as the sizes of the core 310. To achieve a quantum confinement effect, the core 310 necessarily has a smaller size than the exciton Bohr radius according to material of the inorganic luminescent particle 300, and an optical bandgap at a corresponding size.

The shell 320 of the inorganic luminescent particles 300 (e.g., QDs and/or QRs) promotes the quantum confinement effect of the core 310, and determines the stability of the particles 300. Atoms exposed on a surface of colloidal inorganic luminescent particles 300 (e.g., QDs and/or QRs) having only a single structure have lone pair electrons which do not participate in a chemical bond, unlike the internal atoms. Since energy levels of these surface atoms are between the conduction band edge and the valance band edge of the inorganic luminescent particles 300 (e.g., QDs and/or QRs), the charges can be trapped on the surface of the inorganic luminescent particles 300 (e.g., QDs and/or QRs), and thereby resulting in surface defects. Due to a non-radiative recombination process of excitons caused by the surface defects, the luminous efficiency of the inorganic luminescent particles 300 can be degraded, and the trapped charges can react with external oxygen and compounds, leading to a change in the chemical composition of the inorganic luminescent particles 300, or to a permanent loss of the electrical/optical properties of the inorganic luminescent particles 300.

To effectively form the shell on the surface of the core 310, a lattice constant of the material in the shell 320 needs to be similar to that of the material in the core 310. As the surface of the core 310 is enclosed by the shell 320, the oxidation of the core 310 can be prevented, the chemical stability of the inorganic luminescent particles 300 (e.g., QDs and/or QRs) can be enhanced, and the photo-degradation of the core 310 by an external factor such as water or oxygen can be prevented. In addition, the loss of excitons caused by the surface trap on the surface of the core 310 can be minimized, and the energy loss caused by molecular vibration can be prevented, thereby enhancing the quantum efficiency.

In one exemplary aspect, each of the core 310 and the shell 320 can include, but is not limited to, a semiconductor nanocrystal and/or metal oxide nanocrystal having quantum confinement effect. For example, the semiconductor nanocrystal of the core 310 and the shell 320 can be selected from the group, but is not limited to, consisting of Group II-VI compound semiconductor nanocrystal, Group III-V compound semiconductor nanocrystal, Group IV-VI compound semiconductor nanocrystal, Group compound semiconductor nanocrystal and combination thereof.

Particularly, Group II-VI compound semiconductor nanocrystal of the core 310 and/or the shell 320 can be selected from the group, but is not limited to, consisting of MgS, MgSe, MgTe, CaS, CaSe, CaTe, SrS, SrSe, SrTe, BaS, BaSe, BaTe, ZnS, ZnSe, ZnTe, ZnSeS, ZnTeSe, ZnO, CdS, CdSe, CdTe, CdSeS, CdZnS, CdSeTe, CdO, HgS, HgSe, HgTe, CdZnTe, HgCdTe, HgZnSe, HgZnTe, CdS/ZnS, CdS/ZnSe, CdSe/ZnS, CdSe/ZnSe, ZnSe/ZnS, ZnS/CdSZnS, CdS/CdZnS/ZnS, ZnS/ZnSe/CdSe and combination thereof. Group III-V compound semiconductor nanocrystal of the core and/or shell can be selected from the group, but is not limited to, consisting of AlN, AlP, AlAs, AlSb, GaN, GaP, GaAs, GaSb, InN, InP, InAs, InSb, AlGaAs, InGaAs, InGaP, AlInAs, AlInSb, GaAsN, GaAsP, GaAsSb, AlGaN, AlGaP, InGaN, InAsSb, InGaSb, AlGaInP, AlGaAsP, InGaAsP, InGaAsSb, InAsSbP, AlInAsP, AlGaAsN, InGaAsN, InAlAsN, GaAsSbN, GaInNAsSb and combination thereof.

Group IV-VI compound semiconductor nanocrystal of the core 310 and/or shell 320 can be selected from the group, but is not limited to, consisting of $TiO_2$, $SnO_2$, SnS, $SnS_2$, SnTe, PbO, $PbO_2$, PbS, PbSe, PbTe, PbSnTe and combination thereof. Also, Group compound semiconductor nanocrystal of the core 310 and/or shell 320 can be selected from the group, but is not limited to, $AgGaS_2$, $AgGaSe_2$, $AgGaTe_2$, $AgInS_2$, $CuInS_2$, $CuInSe_2$, $Cu_2SnS_3$, $CuGaS_2$, $CuGaSe_2$ and combination thereof. Alternatively, each of the core 310 and the shell 320 can independently include multiple layers each of which has different Groups compound semiconductor nanocrystal, e.g., Group II-VI compound semiconductor nanocrystal and Group III-V compound semiconductor nanocrystal such as InP/ZnS, InP/ZnSe, GaP/ZnS, and the likes, respectively.

In another aspect, the metal oxide nanocrystal of the core 310 and/or shell 320 can include, but is not limited to, Group II or Group III metal oxide nanocrystal. As an example, the metal oxide nanocrystal of the core 310 and/or the shell 320 can be selected from the group, but is not limited to, MgO, CaO, SrO, BaO, $Al_2O_3$ and combination thereof.

The semiconductor nanocrystal of the core 310 and/or the shell 320 can be doped with a rare earth element such as Eu, Er, Tb, Tm, Dy or an arbitrary combination thereof or can be doped with a metal element such as Mn, Cu, Ag, Al or an arbitrary combination thereof.

As an example, the core 310 in QDs or QRs 300 can include, but is not limited to, ZnSe, ZnTe, CdSe, CdTe, InP, ZnCdS, CuxIn1-xS, CuxInl-xSe, AgxIn1-xS and combination thereof. The shell 320 in QDs or QRs 300 can include, but is not limited to, ZnS, GaP, CdS, ZnSe, CdS/ZnS, ZnSe/ZnS, ZnS/ZnSe/CdSe, GaP/ZnS, CdS/CdZnS/ZnS, ZnS/CdSZnS, CdXZn1-xS and combination thereof.

In another exemplary aspect, the inorganic luminescent particle 300 can include, but is not limited to, alloy QD or alloy QR such as homogenous alloy QD or QR or gradient alloy QD or QR, e.g., CdSxSe1-x, CdSexTe1-x, CdXZn1-xS, ZnxCd1-xSe, CuxIn1-xS, CuxIn1-xSe, AgxIn1-xS.

In another exemplary aspect, the inorganic luminescent particle 300 can be QDs or QRs having a Perovskite structure. The inorganic luminescent particle such as The QDs or QRs of the Perovskite structure comprises a core as a luminescent component and optionally a shell. As an example, the core 310 of the inorganic luminescent particle 300 having the Perovskite structure can have the following structure of Chemical Formula 1:

[ABX₃]   [Chemical Formula 1]

In Chemical Formula 1, A is an organic ammonium or alkali metal; B is a metal selected from the group consisting of divalent transition metal, rare earth metal, alkaline earth metal, Pb, Sn, Ge, Ga, In, Al, Sb, Bi, Po and combination thereof; and X is halogen selected from the group consisting of Cl, Br, I and combination thereof.

For example, when the A is an organic ammonium, the inorganic luminescent particle 300 constitutes an inorganic-organic hybrid Perovskite structure. The organic ammonium can comprise, but is not limited to, amidinium-based organic ion, $(CH_3NH_3)_n$, $((C_xH_{2x+1})_nNH_3)_2(CH_3NH_3)_n$, $(CnH_{2n+1}NH_3)_2$, $(CF_3NH_3)$, $(CF_3NH_3)_n$, $((C_xF_{2x+1})_nNH_3)_2(CF_3NH_3)_n$, $((C_xF_{2x+1})_nNH_3)_2$ and/or $(CnF_{2n+1}NH_3)_2$)(each of n and x is independently an integer equal to or more than 1, respectively). More specifically, the organic ammonium can be methyl ammonium or ethyl ammonium.

In addition, the alkali metal of the A can comprise, but is not limited to, Na, K, Rb, Cs and/or Fr. In this case, the inorganic luminescent particle constitutes an inorganic metal Perovskite structure.

For example, when the core 310 of the inorganic luminescent particle 300 having Perovskite structure is the inorganic-organic hybrid Perovskite structure, the inorganic-organic hybrid Perovskite structure has a layered structure in which an inorganic plane in which a metal cation is located is sandwiched between organic planes in which the organic cations are located. In this case, since the difference between the dielectric constant of the organic and inorganic materials is large, exciton is constrained in the inorganic plane constituting the inorganic-organic hybrid Perovskite lattice structure, and thus has the advantage of emitting light having high color purity. Also, when the core 310 of the inorganic luminescent particle 300 having Perovskite structure has the inorganic-organic hybrid Perovskite structure, it can be advantageous in terms of material stability.

By adjusting the composition ratio of each component, the kind and composition ratio of halogen (X) atom in the core 310 of the inorganic luminescent particle 300 having the Perovskite structure, it is possible to synthesize the core emitting light in various wavelengths. In addition, unlike the cores constituting other QDs or QRs, the inorganic luminescent particle 300 having Perovskite structure has a stable lattice structure, and thus luminous efficiency can be improved.

The organic ligand 330 bound to the surface on the inorganic luminescent particle 300 is not particularly limited. For example, the organic ligand 330 can comprise, but is not limited to, $C_5$-$C_{30}$ saturated or unsaturated aliphatic acids such as lauric acid or oleic acid; $C_5$-$C_{20}$ aliphatic amines such as oleylamine; phosphine oxides; and $C_2$-$C_{20}$ alkyl thiols. As an example, the organic ligand 330 can be aliphatic acids.

When the inorganic luminescent particles 300 (e.g., QDs and/or QRs) are synthesized or the EML 240 is disposed using the inorganic luminescent particles 300, some of the organic ligand 300 bound to the surface on the inorganic luminescent particles 300 are detached or separated from the particles 300, thus the surface of the inorganic luminescent particles 300 are exposed to external environment. As the inorganic luminescent particles 300, which is feasible to external environment such as oxygen or moisture, is not protected by the organic ligand 330, voids are formed in some of the EML 240 when the EML 240 consisting only the inorganic luminescent particles 300. In this case, leakage current is occurred in the inorganic LED D1 in which the EML consists of only the inorganic luminescent particles 300.

In addition, atoms exposed on the surface of the shell 320 constituting the outmost of the inorganic luminescent particles 300 have lone pair electrons which do not participate in a chemical bond. Such surface atoms cause charges such as holes and electrons to be trapped on the surface of the inorganic luminescent particles 300, and thereby resulting in surface defects. As the component composition in the shell 320 is changed by the surface defects, there exists a vacancy among the components in the shell 302, and thereby, the lattice constant of the shell 320 is shifted. As a result, as the exciton confinement efficiency in the inorganic luminescent particles 300 are reduced, the inorganic luminescent particles 300 shows deteriorated luminous efficiency.

To address such problems and disadvantages, the EML 240 of the present disclosure includes the siloxane matrix 400 dispersing the inorganic luminescent particles 300.

Figure 3:
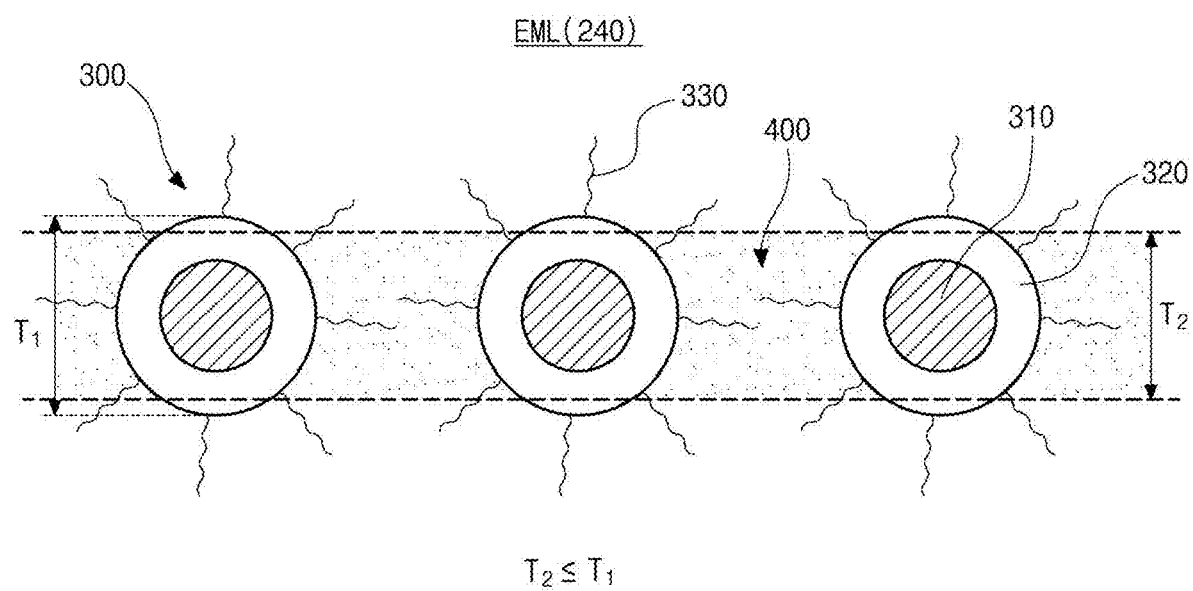
FIG. 3 is a schematic diagram illustrating inorganic luminescent particles dispersed in a siloxane matrix in an emitting material layer of the inorganic LED in accordance with the present disclosure.

Now, we will explain the functions and roles of the siloxane matrix that stabilizes the inorganic luminescent particles 300 in the EML 240 with referring to FIG. 3. As described above, some of the organic ligand 330 that is bound to the surface of the inorganic luminescent particles 300 are detached from the particles 300 in the course of synthesizing the particles 300 or disposing the EML 240, thus the surface defects or voids are formed on the inorganic luminescent particles 300.

On the contrary, the inorganic luminescent particles 300 are dispersed in the siloxane matrix 400 which can form a network structure. As the siloxane matrix 400 having a network structure encloses the inorganic luminescent particles 300, the organic ligand 330 is rarely detached from the surface of the shell 320 which is the outmost of inorganic luminescent particles 300. As a result, the siloxane matrix 400 allows the surface defects on the inorganic luminescent particles 300 to be minimized to stabilize the inorganic luminescent particles 300.

In other words, the siloxane matrix 400 stabilizes the surface of the inorganic luminescent particle to prevent the surface defects of the inorganic luminescent particles 300. In this case, the shift of the lattice constant of the shell 320 caused by the charge traps on the surface of the inorganic luminescent particles 300 or the vacancy of the component in the shell 320 can be minimized. Holes and electrons are recombined in the inorganic luminescent particles 300 in the EML 240 without trapping on the surface of the inorganic luminescent particles 300 to emit stably, thus the exciton confinement efficiency of the inorganic luminescent particles 300 are improved. The inorganic LED D1 in which the EML includes the inorganic luminescent particles 300 dispersed in the siloxane matrix 400 can lower its driving voltage and enhance its luminous efficiency.

The siloxane matrix 400 has a thickness $T_2$ equal to or less than a thickness $T_1$ of a layer of the inorganic luminescent particles 300. When the thickness $T_2$ of the siloxane matrix 400 exceeds the thickness $T_1$ of the layer of the inorganic luminescent particles 300, charges injection can be delayed due the insulator, i.e., the siloxane matrix 400. As an example, when the inorganic luminescent particles 300 are formed in a mono-layer, the thickness $T_2$ of the siloxane matrix 400 can be equal to or less than the size of the inorganic luminescent particles 300, for example, a radius of the inorganic luminescent particles 300 when the particles 300 are quantum dots.

In one exemplar aspect, the thickness $T_2$ of the siloxane matrix 400 can be between about a tenth (10%), preferably about a fourth (25%), and more preferably about a third (33.3%) of the thickness $T_1$ of the layer of the inorganic luminescent particles 330, and the thickness $T_1$ of the layer of the inorganic luminescent particles 330. When the siloxane matrix 400 has the thickness $T_2$ less than a tenth of the thickness $T_1$ of the layer of the inorganic luminescent particles 330, the siloxane matrix 400 does not enclose sufficiently the outside of the inorganic luminescent particles 300. Organic ligands 330 bound to the surface of the inorganic luminescent particles 300 that is not enclosed by the siloxane matrix 400 are detached from the inorganic luminescent particles 300, voids and/or surface defects can be formed on the surface of the inorganic luminescent particles 300.

In one exemplary aspect, the inorganic luminescent particles 300 and the siloxane 400 can be mixed with a volume ratio of about 1:0.01 to about 1:4, preferably about 1:0.5 to about 1:2, and more preferably about 1:0.1 to about 1:1 in fabricating the EML 240. By adjusting the mixing ratio between the inorganic luminescent particles 300 and the siloxane 400, the EML 240 in which the thickness $T_2$ of the siloxane matrix 400 is between a tenth or more of the layer thickness $T_1$ of the inorganic luminescent particles 300 and equal to or less that the layer thickness $T_1$ of the inorganic luminescent particles 300 can be fabricated.

The siloxane matrix 400 can be synthesized a monomer comprising at least one silanol group and/or a siloxane group. Such monomers can crosslink each other through curing processes such as heat treatment to form the siloxane matrix 400. As an example, the monomer having the silanol group can comprise a silanol group-containing monomer such as ethylene-based unsaturated alkoxy silanes and ethylene-based unsaturated acyloxy silanes that is obtained by hydrolyzing a silyl group-containing unsaturated monomer.

For example, the ethylene-based unsaturated alkoxy silanes can comprise, but is not limited to, 1) acrylate-based alkoxy silanes such as -acryloxypropyl-trimethoxy silane, γ-acryloxypropyl-triethoxy silane, 2) methacrylate-based alkoxy silanes such as γ-methacryloxypropyl-trimethoxy silane, γ-methacryloxypropyl-triethoxy silane, γ-methacryloxymethyl-triethoxysilane, γ-methacryloxypropyl-tris(2-methoxyethoxy)silane.

Ethylene-based unsaturated acyloxy silanes can comprise, but is not limited to, acrylate-based acetoxy silanes, methacrylate-based acetoxy silanes and ethylene-based unsaturated acetoxy silanes (e.g., acrylatopropyl triacetoxy silane, methacrylatopropyl triacetoxy silane).

Silyl group-containing unsaturated compound that can obtained the monomer having the silanol group through hydrolysis can comprise, but is not limited to, chlorodimethyl vinyl silane, 5-trimethylsilyl-1,3-cyclopentadiene, 3-trimethylsilylallyl alcohol, trimethylsilyl methacrylate, 1-trimethylsilyl-1,3-butadiene, 1-trimethylsilyl cyclopentene, 2-trimethylsilyloxyethyl methacrylate, 2-trimethylsilyl oxyfuran, 2-trimethylsily oxypropene, and trisalkoxy silanes such as allyloxy-t-butyl dimethyl silane, allyloxy-trimethyl silane, trimethoxy-vinyl silane, triethoxy-vinyl silane, tris(methoxyethoxy) vinyl silane. Such a monomer having the silanol group can be used alone or in combination of two or more.

In another exemplary aspect, a precursor for the siloxane matrix 400 comprises a monomer having the siloxane group. The monomer having the siloxane group can include a monomer having a linear siloxane group, a monomer having a cyclic siloxane group, a monomer having a tetrahedral siloxane group and silsesquioxane.

As an example, the monomer having the linear siloxane group can comprise an alkyl siloxane, an alkoxy siloxane, an alkylalkoxy siloxane, a vinylalkoxy siloxane each of which is substituted with 4-8 $C_1$-$C_{10}$ alkyl groups and/or $C_1$-$C_{10}$ alkoxy groups. For example, the monomer having the linear siloxane group can have the following structure of Chemical Formula 2:

[Chemical Formula 2]

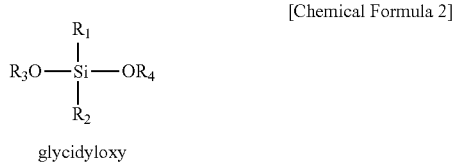

glycidyloxy

In Chemical Formula 2, each of $R_1$ and $R_2$ is independently selected from the group consisting of protium, deuterium, tritium, a hydroxyl group, a linear or branched $C_1$-$C_{10}$ alkyl group, a $C_2$-$C_{20}$ alkenyl group, a $C_1$-$C_{10}$ alkoxy group, a $C_1$-$C_{10}$ alkyl amino group, a $C_1$-$C_{10}$ alkyl acryloxy group, a $C_1$-$C_{10}$ alkyl methacryloxy group, a thiol group, a $C_1$-$C_{10}$ alkyl thiol group, an ioscyanate group, a $C_1$-$C_{10}$ alkyl ioscyanate group, an epoxy group, a $C_1$-$C_{10}$ epoxy group, a $C_5$-$C_{20}$ cycloaklyl epoxy group, a $C_6$-$C_{20}$ aryl epoxy group, a $C_4$-$C_{20}$ hetero aryl epoxy group, a glycidyloxy group, a $C_1$-$C_{10}$ alkyl glycidyloxy group, an unsubstituted or halogen substituted $C_6$-$C_{20}$ aryl group, an unsubstituted or halogen substituted $C_4$-$C_{20}$ hetero aryl group, an unsubstituted or halogen substituted $C_6$-$C_{20}$ aryloxy group, an unsubstituted or halogen substituted $C_4$-$C_{20}$ hetero aryloxy group, an unsubstituted or halogen substituted $C_6$-$C_{20}$ aryl amino group and an unsubstituted or halogen substituted $C_4$-$C_{20}$ hetero aryl amino group; each of $R_3$ and $R_4$ is independently selected from the group consisting of protium, deuterium, tritium, a linear or branched $C_1$-$C_{10}$ alkyl group, a $C_1$-$C_{10}$ alkyl amino group, a $C_6$-$C_{20}$ aryl group, a $C_4$-$C_{20}$ hetero aryl group, a $C_6$-$C_{20}$ aryl amino group and a $C_4$-$C_{20}$ hetero aryl amino group.

In one exemplary aspect, the linear or branched $C_1$-$C_{10}$ alkyl group in each of $R_1$ to $R_4$ can be a linear or branched $C_1$-$C_{10}$ alkyl group. In another exemplary aspect, the unsubstituted or halogen substituted $C_6$-$C_{20}$ aryl group in each of $R_1$ to $R_4$ cancan comprise independently, but is not limited to, phenyl, biphenyl, terphenyl, naphthyl, anthracenyl, pentalenyl, indenyl, indeno-indenyl, heptalenyl, biphenylenyl, indacenyl, phenalenyl, phenanthrenyl, benzo-phenanthrenyl, dibenzo-phenanthrenyl, azulenyl, pyrenyl, fluoranthenyl, triphenylenyl, chrysenyl, tetraphenylenyl, tetracenyl, pleiadenyl, picenyl, pentaphenylenyl, pentacenyl, fluorenyl, indeno-fluorenyl and spiro-fluorenyl, preferably phenyl, biphenyl, naphthyl, anthracenyl and indenyl, each of which can be unsubstituted or substituted with halogen.

In still another exemplary aspect, the $C_4$-$C_{20}$ hetero aryl group in each of $R_1$ to $R_4$ can comprise independently, but is not limited to, an unfused or fused hetero aryl group such as pyrrolyl, pyridyl, pyridinyl, pyrimidinyl, pyrazinyl, pyridazinyl, triazinyl, tetrazinyl, imidazolyl, pyrazolyl, indolyl, iso-indolyl, indazolyl, indolizinyl, pyrrolizinyl, carbazolyl, benzo-carbazolyl, dibenzo-carbazolyl, indolo-carbazolyl, indeno-carbazolyl, benzo-furo-carbazolyl, benzothieno-carbazolyl, carbolinyl, quinolinyl, iso-quinolinyl, phthlazinyl, quinoxalinyl, cinnolinyl, quinazolinyl, quinolizinyl, purinyl, benzo-quinolinyl, benzo-iso-quinolinyl, benzo-quinazolinyl, benzo-quinoxalinyl, acridinyl, phenazinyl, phenoxazinyl, phenothiazinyl, phenanthrolinyl, perimidinyl, phenanthridinyl, phtheridinyl, naphthyridinyl, furanyl, pyranyl, oxazinyl, oxazolyl, oxadiazolyl, triazolyl, dioxinyl, benzo-furanyl, dibenzo-furanyl, thiopyranyl, xanthenyl, chromenyl, iso-chromenyl, thioazinyl, thiophenyl, benzo-thiophenyl, dibenzo-thiophenyl, difuro-pyrazinyl, benzofuro-dibenzo-furanyl, benzothieno-benzo-thiophenyl, benzothieno-dibenzo-thiophenyl, benzothieno-benzo-furanyl, benzothieno-dibenzo-furanyl, xanthne-linked spiro acridinyl, dihydroacridinyl, preferably pyridyl and pyrimidinyl, each of which is unsubstituted or substituted with halogen.

For example, $R_1$ in Chemical Formula 2 can be selected from the group consisting of protium, deuterium, tritium, a hydroxyl group, a linear or branched $C_1$-$C_{10}$ alkyl group, a $C_2$-$C_{20}$ alkenyl group, a $C_1$-$C_{10}$ alkoxy group, a $C_1$-$C_{10}$ alkyl amino group, a $C_1$-$C_{10}$ alkyl acryloxy group, a $C_1$-$C_{10}$ alkyl methacryloxy group, a thiol group, a $C_1$-$C_{10}$ alkyl thiol group, a $C_1$-$C_{10}$ alkyl glycidyloxy group and a $C_6$-$C_{20}$ aryl group, $R_2$ can be selected from the group consisting of a hydroxyl group and a $C_1$-$C_{10}$ alkoxy group, and each of $R_3$ and $R_4$ can be independently selected from the group consisting of protium, deuterium, tritium and a linear or branched $C_1$-$C_{10}$ alkyl group.

In one exemplary aspect, the silicon atom in the siloxane monomer that can form the siloxane matrix 400 can be substituted with at least two, preferably at least three hydrolysable groups such as an alkoxy group, an unsubstituted or halogen substituted aryloxy group and/or an unsubstituted or halogen substituted hetero aryloxy group.

As an example, the siloxane monomer having the structure of Chemical Formula 2 can comprise alkoxy silanes having at least two alkoxy groups as the hydrolysable groups. For example, the siloxane monomer having two alkoxy groups can comprise, but is not limited to, dimethyldiethoxy silane, methyl (vinyl) diethoxy silane, 3-aminopropyl (methyl) diethoxy silane, (3-acryloxypropyl) methyldimethoxy silane, 3-glycidoxypropyl (methyl) diethoxy silane and methyl (phenyl) diethoxy silane.

The siloxane monomer having three alkoxy groups can comprise, but is not limited to, methyl trimethoxy silane, methyl triethoxy silane, ethyl triethoxy silane, n-propyl triethoxy silane, octyl triethoxy silane, vinyl triethoxy silane, 3-aminopropyl trimethoxy silane, 3-aminopropyl triethoxy silane, 3-(2-aminoethylamino) propyl trimethoxy silane, (3-acryoxyoropyl) trimethoxy silane, methacryloxymethyl triethoxy silane, 3-methacryloxypropyl trimethoxy silane, 3-methacryloxypropyl triethoxy silane, 3-mercaptopropyl triethoxy silane, 3-isocyanatopropyl triethoxy silane, 2-(3,4-epoxycyclohexyl) ethyl triethoxy silane, 3-glycidyloxyopropyl trimethoxy silane, 3-glycidyloxypropyl trimethoxy silane, 3-glycidyloxypropyl triethoxy silane, phenyl trimethoxy silane, (4-chlorophenyl) triethoxy silane and [3-(phenylamino) propyl] trimethoxy silane.

The siloxane monomer having four alkoxy groups can comprise, but is not limited to, tetramethyl orthosilicate (TMOS), tetraethyl orthosilicate (TEOS), tetrapropyl orthosilicate (TPOS), tetrabutyl orthosilicate (TBOS) and tetrakis (2-ethylhexyl) orthosilicate (TEHOS).

The cyclic siloxane monomer can comprise, but is not limited to, cyclo trisiloxane such as methyl hydro-cyclosiloxane, hexamethyl-cyclotrisilosane and hexaethyl-cyclo trisiloxane; cyclo tetrasiloxane such as tetraoctyl-cyclo tetrasiloxane; tetra- or penta-methyl cyclo tetrasiloxane; tetra-, penta-, hexa- or hepta-methyl cyclo pentasiloxane; penta- or hexa-methyl-cyclo hexasiloxane, tetraethyl-cyclo tetrasiloxane and tetraphenyl cyclo tetrasiloxane; decamethyl-cyclo pentasiloxane, dodecamethyl-cyclosiloxane, 1,3,5,7-tetramethyl-cyclo tetrasiloxane, 1,3,5,7,9-pentamethyl-cyclo pentasiloxane, 1,3,5,7,9,11-hexamethyl-cyclo hexasiloxane and combination thereof.

The monomer having the tetrahedral siloxane group can comprise, but is not limited to, tetrakis dimethyl siloxy silane, tetrakis diphenyl siloxy silane and tetrakis diethyl siloxy silane.

In addition to the linear, cyclic or tetrahedral siloxane, silsesquionxne (SSQ), for example, that can by synthesized by a reaction between methyl trichloro siloxane and dimethyl chloro siloxane, can be used as the precursor for the siloxane matrix 400. Silsesquioxane can be cross-linked to synthesize poly-silsesquioxane having a ladder or a cage structure. For example, organo trichloro siloxane is hydrolyzed to synthesize a heptamer siloxane having a partial cage structure and a heptamer or an octamer siloxane having a cage structure. The obtained heptamer siloxane can be separated by solubility differences, and then the separated heptamer siloxane and organo trialkoxy silane or organo trichloro siloxane are condensed to obtain a silsesquioxane monomer. The silsesquioxane can have, but is not limited to, a chemical structure $RSiO_{3/2}$ (R is hydrogen, a $C_1$-$C_{10}$ alkyl group, a $C_2$-$C_{10}$ alkenyl group, an aryl group such as phenyl, or an arylene group), In one exemplary aspect, the siloxane monomer for the siloxane matrix 400 can be an orthosilicate having four siloxane groups such as TMOS, TEOS, TPOS, TBOS and TEHOS. The orthosilicate is chemically stable, and can form network structures by heat to form the siloxane matrix 400.

When the EML 240 includes inorganic luminescent particles 300 such as QDs and/or QRs and the siloxane matrix 400 dispersing the inorganic luminescent particles 300, the EML 240 can be fabricated using a solution in which the inorganic luminescent particles 300 and the siloxane 400 are dispersed in an organic solvent, typically a $C_1$-$C_{20}$ aliphatic hydrocarbon such as a $C_3$-$C_{20}$ alkane. As an example, the EML 240 can be fabricated by applying the solution in which the inorganic luminescent particles 300 and the siloxane 400 are dispersed in the solvent on the CTL1 250 and then by evaporating the solvent to disperse the inorganic luminescent particles 300 in the siloxane matrix 400. In one exemplary aspect, the EML 240 can be fabricated on the CTL1 250 using any soluble process such as spin coating, drop coating, dip coating, spray coating, roll coating, flow coating casting, screen printing and inkjet printing, or a combination thereof.

In one exemplary aspect, the EML 240 can include inorganic luminescent particles 300 such as QDs and/or QRs having photoluminescence (PL) wavelength peaks of 440 nm, 530 nm, and 620 nm so as to realize white LED. Optionally, the EML 240 can include inorganic luminescent particles 300 such as QDs or QRs having any one of red, green and blue colors, and can be formed to emit any one color. As an example, the EML 240 can have a thickness of, but is not limited to, about 5 nm to about 300 nm, preferably about 10 nm to about 200 nm.

Referring back to FIG. 2, in this aspect, the CTL1 250 can be a hole transfer layer which provides holes with the EML 240. As an example, the CTL1 250 can include a hole injection layer (HIL) 252 disposed adjacently to the first electrode 210 between the first electrode 210 and the EML 240, and a hole transport layer (HTL) 254 disposed adjacently to the EML 240 between the first electrode 210 and the EML 240.

The HIL 252 facilitates the injection of holes from the first electrode 210 into the EML 240. As an example, the HIL 252 can include, but is not limited to, an organic material selected from the group consisting of poly(ethylenedioxythiophene).polystyrenesulfonate (PEDOT:PSS); 4,4',4"-tris (diphenylamino)triphenylamines (TDATA) doped with tetrafluoro-tetracyano-quinodimethane (F4-TCNQ); p-doped phthalocyanine such as zinc phthalocyanine (ZnPc) doped withF4-TCNQ; N,N'-diphenyl-N,N'-bis(1-naphthyl)-1,1'-biphenyl-4,4"-diamine (α-NPD) doped with F4-TCNQ; hexaazatriphenylene-hexanitrile (HAT-CN); and a combination thereof. As an example, the HIL 252 can include the dopant such as F4-TCNQ in about 1 to about 30% by weight. The HIL 252 can be omitted in compliance with a structure of the inorganic LED D1.

The HTL 254 transports holes from the first electrode 210 into the EML 240. The HTL 254 can include an inorganic material or an organic material. As an example, when the HTL 254 includes an organic material, the HTL 254 can include, but is not limited to, 4,4'-bis(p-carbazolyl)-1,1'-biphenyl compounds such as 4,4'-bis(N-carbazolyl)-1,1'-biphenyl (CBP) and 4,4'-bis(9-carbazolyl)-2,2'-dimethylbiphenyl (CDBP); aromatic amines, i.e. aryl amines or polynuclear aromatic amines selected from the group consisting of α-NPD, N4,N4'-di(naphthalene-1-yl)-N4,N4'-bis (4-vinylphenyl)biphenyl-4,4'-diamine (VNPB), N,N'-diphenyl-N,N'-bis(3-methylphenyl)-(1,1'-biphenyl)-4,4'-diamine (TPD), N,N'-bis(3-methylphenyl)-N,N'-bis(phenyl)-spiro (spiro-TPD), N,N'-di(4-(N,N'-diphenyl-amino)phenyl)-N, N'-diphenylbenzidine (DNTPD), N,N'-Bis(3-methylphenyl)-N,N'-bis(phenyl)-9,9'-dioctylfluorene (DOFL-TPD), N2,N7-Di(naphthalene-1-yl)-9,9-dioctyl-N2,N7-diphenyl-9H-fluorene-2,7-diamine (DOFL-NPB), N4,N4'-Bis(4-(6-((3-ethyloxetan-3-yl)methoxy)hexyl)phenyl)-N4,N4'-diphenylbiphenyl-4,4'-diamine (OTPD), tris(4-carbazolyl-9-ylphenyl)amine (TCTA), tetra-N-phenylbenzidine (TPB), tris(3-methylphenylphenylamino)-triphenylamine (m-MTDATA), poly(9,9'-dioctylfluorenyl-2,7-diyl)-co-(4,4'-(N-(4-sec-butylphenyl)diphenylamine (TFB), poly(4-butylphenyl-dipnehyl amine) (poly-TPD), spiro-NPB and combination thereof, conductive polymers such as polyaniline, polypyrrole, PEDOT:PSS; poly(N-vinylcarbazole) (PVK) and its derivatives; poly(para)phenylene vinylenes (PPV) and its derivatives such as poly[2-methoxy-5-(2-ethylhexyloxy)-1, 4-phenylene vinylene] (MEH-PPV), poly[2-methoxy-5-(3', 7'-dimethyloctyloxy)-1,4-phenylene vinylene] (MOMO-PPV); polymethacrylate and its derivatives; poly(9,9-octylfluorene) and its derivatives; poly(spiro-fluorene) and its derivatives; polyvinylfluoro and its derivatives such as poly[9-sec-butyl-2,7-difluoro-9H-carbazole] (2,7-F-PVF); metal complexes such as copper phthalocyanine (CuPc); and combination thereof.

In one exemplary aspect, the HTL 254 can have a multi-layered structure of a first HTL (HTL1) disposed between the HIL 252 and the EML 240 and a second HTL (HTL2) disposed between the HTL1 and the EML 240. In this case, the HTL2 can be designed to have HOMO (Highest Occupied Molecular Orbital) energy deeper than HOMO energy level of the HTL1. As an example, the HTL1 can include, but is not limited to, TFB (HOMO: −5.3 eV), poly-TPD (HOMO: −5.1 eV) and/or VNPG (HOMO: −5.58 eV), and the HTL2 can include, but is not limited to, CBP (HOMO: −6.15 eV), PVK (HOML: −5.91 eV) and/or 2,7-F-PVF (HOMO: −6.3 eV).

Alternatively, when the HTL 254 includes an inorganic material, the HTL 254 can comprise an inorganic material selected from the group consisting of a metal oxide nanocrystal, a non-oxide metal nanocrystal and combination thereof. The metal oxide nanocrystal that can be used in the HTL 254 can be oxide nanocrystal of metal selected from Zn, Ti, Ni, Co, Cu, W, Sn, Cr, V, Mo, Mn, Pb, Ce, Re and combination thereof. For example, the metal oxide nanocrystal that can be used in the HTL 254 can be selected from, but is not limited to, the group consisting of ZnO, $TiO_2$, CoO, CuO, $Cu_2O$, FeO, $In_2O_3$, MnO, NiO, PbO, SnOx, $Cr_2O_3$, $V_2O_5$, $Ce_2O_3$, $MoO_3$, $Bi_2O_3$, $ReO_3$ and combination thereof. The non-oxide metal nanocrystal can comprise, but is not limited to, CuSCN, $Mo_2S$ and p-type GAN. Alternatively, the metal oxide and/or the non-oxide metal nanocrystal in the HTL 254 can be doped with a p-dopant. As an example, the p-dopant can be selected from, but is not limited to, $Li^+$, $Na^+$, $K^+$, $Sr^+$, $Ni^{2+}$, $Mn^{2+}$, $Pb^{2+}$, $Cu^+$, $Cu^{2+}$, $C^{2+}$, $Al^{3+}$, $Eu^{3+}$, $In^{3+}$, $Ce^{3+}$, $Er^{3+}$, $Tb^{3+}$, $Nd^{3+}$, $Y^{3+}$, $Cd^{2+}$, $Sm^{3+}$, N, P, As and combination thereof.

In FIG. 2, while the CTL1 250 is divided into the HIL 252 and the HTL 254, the CTL1 250 can have a mono-layered structure. For example, the CTL1 250 can include only the HTL 254 without the HIL 252 or can include the above-mentioned hole transporting material doped with the hole injection material (e.g., PEDOT:PSS).

The CTL1 250 including the HIL 252 and the HTL 254 can be laminated by any vacuum deposition process such as vacuum vapor deposition and sputtering, or by any soluble process such as spin coating, drop coating, dip coating, spray coating, roll coating, flow coating, casting, screen printing and inkjet printing, or a combination thereof. For example, each of the HIL 252 and the HTL 254 can have a thickness, but is not limited to, between about 10 nm and 200 nm, alternatively, about 10 nm and 100 nm.

The CTL2 270 is disposed between the EML 240 and the second electrode 230. In this aspect, the CTL2 270 can be an electron transfer layer which provides electrons into the EML 240. In one exemplary aspect, the CTL2 270 can include an electron injection layer (EIL) 272 disposed adjacently to the second electrode 230 between the second electrode 230 and the EML 240, and an electron transport layer (ETL) 274 disposed adjacently to the EML 240 between the second electrode 230 and the EML 240.

The EIL 272 facilitates the injection of electrons from the second electrode 230 into the EML 240. For example, the EIL 272 can include, but is not limited to, a metal such as Al, Cd, Cs, Cu, Ga, Ge, In and/or Li, each of which is undoped or doped with fluorine; and/or metal oxide such as $TiO_2$, ZnO, $ZrO_2$, $SnO_2$, $WO_3$ and/or $Ta_2O_3$, each of which is undoped or doped with Al, Mg, In, Li, Ga, Cd, Cs or Cu.

The ETL 274 transfers electrons into the EML 240 and comprises an inorganic material or an organic material. In one exemplary aspect, the ETL 274 can include an inorganic material so as to prevent an interface defect from being formed at an interface between the EML 240 and the ETL 274, and thereby securing driving stability of the inorganic LED D1. In addition, when the ETL 274 includes an inorganic material having high charge mobility, the electron transport rate provided from the second electrode 230 can be improved, and electrons can be transported efficiently into the EML 240 owing to high electron levels or concentrations.

Moreover, in one exemplary aspect, the ETL 274 can include an inorganic material having relatively deep VB (valence band) energy level compared to VB energy level of the inorganic luminescent particles 300 in the EML 240. As an example, an inorganic material having wide energy level bandgap (Eg) between the VB energy level and a CB (conduction band) energy level can be used as an electron transporting material of the ETL 274. In this case, electrons can be efficiently injected into the EML 240 from the second electrode 230 via the ETL 274.

In one exemplary aspect, the ETL 274 can comprise, but is not limited, an inorganic material such as a metal oxide nanocrystal, a semiconductor nanocrystal, a nitride and/or combination thereof. For Example, the ETL 274 can comprise the metal oxide nanocrystal.

As an example, the metal oxide nanocrystal in the ETL 274 can comprise, but is not limited to, an oxide nano particle of a metal component selected from the group consisting of Zn, Ca, Mg, Ti, Sn, W, Ta, Hf, Al, Zr, Ba and combination thereof. More particularly, the metal oxide in the ETL 274 can comprise, but is not limited to, $TiO_2$, ZnO, ZnMgO, ZnCaO, $ZrO_2$, $SnO_2$, SnMgO, $WO_3$, $Ta_2O_3$, $HfO_3$, $Al_2O_3$, $BaTiO_3$, $BaZrO_3$ and combination thereof. The semiconductor nanocrystal in the ETL 274 can comprise, but is not limited to CdS, ZnSe, ZnS, and the like, the nitride in the ETL 274 can comprise, but is not limited to, $Si_3N_4$.

In one exemplary aspect, the ETL 274 can be designed to have the CB (or LUMO) energy level substantially equal to the CB energy level of the EML 240 while the VB energy level deeper than the VB energy level of the EML 240. To this end, the ETL 274 can further include a material (n-dopant) doped to the inorganic nanocrystals. The n-dopant in the ETL 274 can comprise, but is not limited to, cation of metal selected from Al, Mg, In, Li, Ga, Cd, Cs and Cu, particularly trivalent cation.

In an alternative aspect, when the ETL 274 comprises an organic material, the ETL 274 can comprise, but is not limited to, oxazole-based compounds, isoxazole-based compounds, triazole-based compounds, isotriazole-based compounds, oxadiazole-based compounds, thiadiazole-based compounds, phenanthroline-based compounds, perylene-based compounds, benzoxazole-based compounds, benzothiazole-based compounds, benzimidazole-based compounds, triazine-based compounds and aluminum complexes.

More particularly, the organic material in the ETL 274 can comprise, but is not limited to, 3-(4-Biphenyl)-4-phenyl-5-tert-butylphenyl-1,2,4-triazole (TAZ), 2,9-Dimethyl-4,7-diphenyl-1,10-phenaathroline (bathocuproine, BCP), 1,3,5-benzinetriyl)-tris(1-phenyl-1-H-benzimidazole (TPBi), Tris (8-hydroxyquinoline)aluminum (Alq$_3$), bis(2-methyl-8-quninolinato)-4-phenylphenolatealuminum (III) (BAlq), bis (2-methyl-quinolinato)(tripnehylsiloxy) aluminum (III) (Salq) and combination thereof.

Similar to the CTL1 250, while FIG. 2 illustrates the CTL2 270 as a bi-layered structure including the EIL 272 and the ETL 274, the CTL2 270 can have a mono-layered structure having only the ETL 274. Alternatively, the CTL2 270 can have a mono-layered structure of ETL 274 including a blend of the above-described electron-transporting inorganic material with cesium carbonate.

The CTL2 270, which includes the EIL 272 and/or the ETL 274 having the inorganic material, can be fabricated on the EML 240 by any vacuum deposition process such as vacuum vapor deposition and sputtering, or soluble process such as spin coating, drop coating, dip coating, spray coating, roll coating, flow coating, casting, screen printing and inkjet printing, or combination thereof. As an example, each of the EIL 272 and the ETL 274 can have a thickness, but is not limited to, between about 10 nm and about 200 nm, alternatively, about 10 nm and 100 nm.

For example, the inorganic LED D1 can have a hybrid CTL structure in which the HTL 254 of the CTL1 250 includes the organic material as describe above and the CTL2 270, for example, the ETL 274 includes the inorganic material as described above. In this case, The inorganic LED D1 can enhance its luminous properties.

Figure 4:
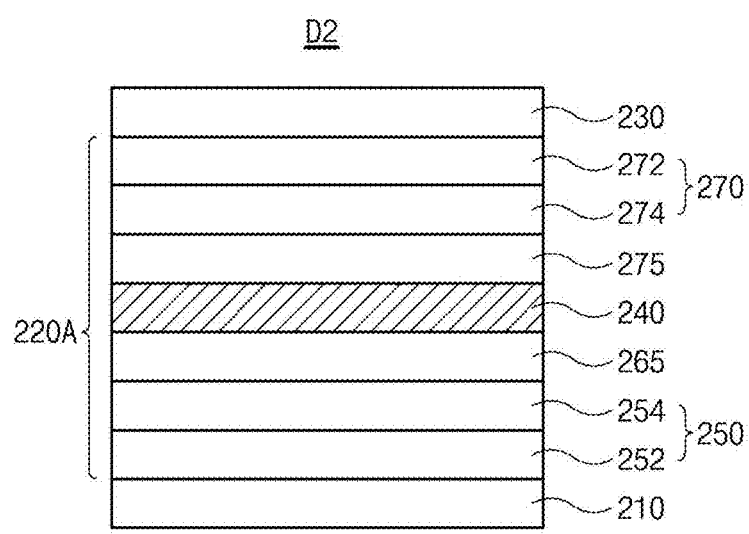
FIG. 4 is a schematic cross-sectional view illustrating an inorganic light emitting diode (LED) in accordance with another exemplary aspect of the present disclosure.

In the first aspect, the emissive layer includes only an EML and charge transfer layers. Unlikely, the inorganic LED of the present disclosure can further comprise at least one exciton blocking layer that controls the charger transfers. FIG. 4 is a schematic cross-sectional view illustrating an inorganic light emitting diode (LED) in accordance with another exemplary aspect of the present disclosure.

As illustrated in FIG. 4, the inorganic LED D2 includes the first electrode 210, the second electrode 230 facing the first electrode 210 and an emissive layer 220A disposed between the first and second electrodes 210 and 230. The inorganic light emitting display device 100 (FIG. 1) can include a red pixel region, a green pixel region, and a blue pixel region, and the inorganic LED D2 can be disposed in any pixel region of the red, green and blue pixel regions. The emissive layer 220A comprises the EML 340, and can comprise at least one of the CTL1 350 disposed between the first electrode 210 and the EML 240 and the CTL2 270 disposed between the EML 240 and the second electrode 230. In addition, the emissive layer 220A further comprise an EBL 265 as a first exciton blocking layer disposed between the CTL1 250 and the EML 240 and a HBL 275 as a second exciton blocking layer disposed between the EML 240 and the CTL2 270. The configuration of the electrodes 210 and 230 and the emissive layer 220A other than the EBL 265 and HBL 275 can be substantially the same as the corresponding elements in the inorganic LED D1.

The EBL 265 prevents reduction of the luminous lifetime and luminous efficiency of the inorganic LED D2 when electrons are transferred to the first electrode 210 through the EML 240. In other words, the EBL 265 prevents the electron transfer between the HTL 254 and the EML 240. In one exemplary aspect, the EBL 265 can comprises, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, tri-p-tolylamine, 1,1-bis(4-(N,N'-di(ptolyl)amino)phenyl)cyclohexane (TAPC), m-MTDATA, 1,3-bis(N-carbazolyl)benzene (mCP), 3,3'-bis(N-carbazolyl)-1,1'-biphenyl (mCBP), poly-TPD, CuPc, DNTPD and 1,3,5-tris[4-(diphenylamino)phenyl]benzene(TDAPB).

The HBL 275 prevents reduction of the luminous lifetime and luminous efficiency of the inorganic LED D2 when holes are transferred to the second electrode 230 through the EML 240. In other words, the HBL 275 prevents the hole transfer between the ETL 274 and the EML 240. In one exemplary aspect, the HBL 275 can comprise, but is not limited to, oxadiazole-based compounds, triazole-based compounds, phenanthroline-based compounds, benzoxazole-based compounds, benzothiazole-based compounds, benzimidazole-based compounds, triazine-based compounds and aluminum complexes. For example, the HBL 275 can comprise a compound having a relatively low HOMO energy level compared to the luminescent materials in EML 240. The HBL 275 can comprise, but is not limited to, BCP, BAlq, Alq$_3$, 2-biphenyl-4-yl-5-(4-t-butylphenyl)-1, 3,4-oxadiazole (PBD), PBD, spiro-PBD and Liq.

The EML 240 in the emissive layer 220A also comprises the inorganic luminescent particles 300 and the siloxane matrix 400 dispersing the inorganic luminescent particles 300 (see, FIG. 3). The siloxane matrix 400 has the thickness $T_2$ equal to or less than the thickness $T_1$ of the layer of the inorganic luminescent particles 300, and preferably, a tenth or more, preferably a fourth or more, and more preferably a third or more of the thickness $T_1$ of the layer of the inorganic luminescent particles 300. The siloxane matrix 400 having the predetermined thickness $T_1$ in the EML 240 allows the inorganic luminescent particles 300 to become much stabilized and the surface defects on the inorganic luminescent particles 300 to be minimized, and therefore stabilizes excitons formed by recombination among holes and electrons in the EML 240. As a result, the inorganic LED D2 can lower its driving voltage and power consumption as well as improve its luminous efficiency.

Figure 5:
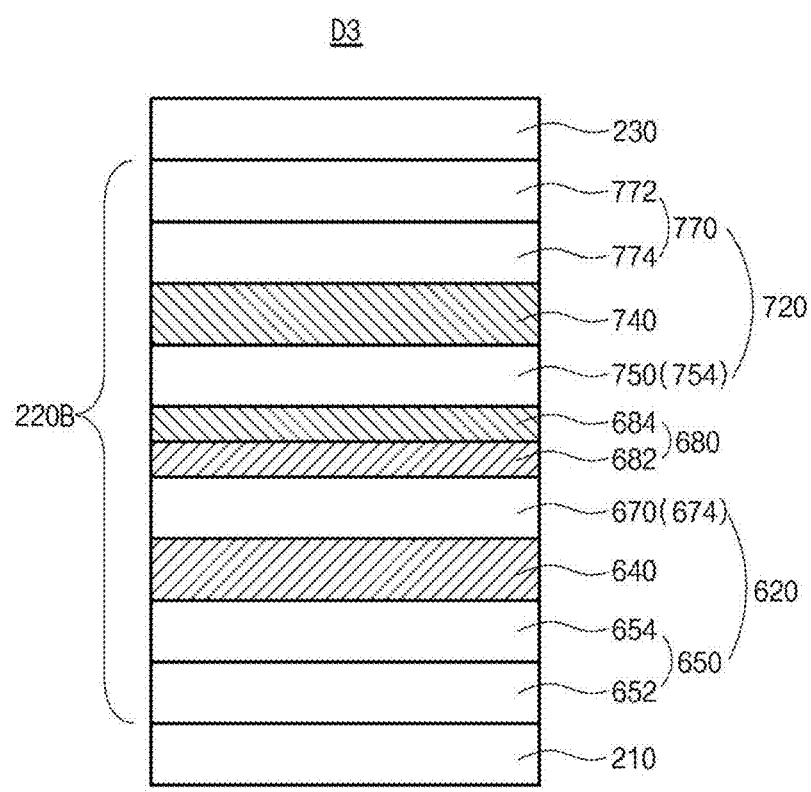
FIG. 5 is a schematic cross-sectional view illustrating an inorganic light emitting diode (LED) in accordance with still another exemplary aspect of the present disclosure.

In an alternative aspect, an inorganic LED can include multiple emitting parts. FIG. 5 is a schematic cross-sectional view illustrating an OLED in accordance with still another exemplary aspect of the present disclosure.

As illustrated in FIG. 5, the inorganic LED D3 comprises first and second electrodes 210 and 230 facing each other and an emissive layer 220B with two emitting parts disposed between the first and second electrodes 210 and 230. The inorganic light emitting display device 100 (FIG. 1) can include a red pixel region, a green pixel region and a blue pixel region, and the inorganic LED D3 can be disposed in any pixel region of the red, green and blue pixel regions. The first electrode 210 can be an anode and the second electrode 220 can be a cathode.

The emissive layer 220B includes a first emitting part 620 that includes a first EML (EML1) 640, and a second emitting part 720 that includes a second EML (EML2) 740. Also, the emissive layer 220B can further comprise a charge generation layer (CGL) 680 disposed between the first emitting part 620 and the second emitting part 720.

The CGL 680 is disposed between the first and second emitting parts 620 and 720 so that the first emitting part 620, the CGL 680 and the second emitting part 720 are sequentially disposed on the first electrode 210. In other words, the first emitting part 620 is disposed between the first electrode 210 and the CGL 680 and the second emitting part 720 is disposed between the second electrode 230 and the CGL 680.

The first emitting part 620 comprises the EML1 640. The first emitting part 620 can comprise at least one of a lower first charge transfer layer (first hole transfer layer) 650 disposed between the first electrode 210 and the EML1 640 and a lower second charge transfer layer (first electron transfer layer) 670 disposed between the EML1 640 and the CGL 680. In one exemplary aspect, the first hole transfer layer 650 can comprise a HIL 652 disposed between the first electrode 210 and the EML1 640 and a first HTL (HTL1) 654 disposed between the EML1 640 and the HIL 652. Alternatively, the first hole transfer layer 650 can have a single-layered structure of the HTL1 654. The first electron transfer layer 670 can have a single-layered structure of a first ETL (ETL1) 674. Alternatively, the first emitting part 620 can further comprise a first EBL (EBL1) disposed between the EML1 640 and the first hole transfer layer 650 and/or a first HBL (HBL1) disposed between the EML1 640 and the first electron transfer layer 670.

The second emitting part 720 comprises the EML2 740. The second emitting part 720 can comprise at least one of an upper first charge transfer layer (second hole transfer layer) 750 disposed between the CGL 680 and the EML2 740 and an upper second charge transfer layer (second electron transfer layer) 770 disposed between the second electrode 230 and the EML2 740. The second hole transfer layer 750 can have a single-layered structure of a second HTL (HTL2) 754. In one exemplary aspect, the second hole transfer layer 770 can comprise an EIL 772 and a second ETL (ETL2) 774 each of which is disposed sequentially between the second electrode 230 and the EML2 740. Alternatively, the second electron transfer layer 770 can have a single-layered structure of the ETL2 774. Alternatively, the second emitting part 720 can further comprise a second EBL (EBL2) disposed between the EML2 740 and the second hole transfer layer 750 and/or a second HBL (HBL2) disposed between the EML2 740 and the second electron transfer layer 770.

The CGL 680 is disposed between the first emitting part 620 and the second emitting part 720. The first emitting part 620 and the second emitting part 720 are connected via the CGL 680. The CGL 680 can be a PN-junction CGL that junctions an N-type CGL (N-CGL) 682 with a P-type CGL (P-CGL) 684.

The N-CGL 682 is disposed between the first electron transfer layer 670 and the second hole transfer layer 750 and the P-CGL 684 is disposed between the N-CGL 682 and the second hole transfer layer 750. The N-CGL 682 transports electrons to the EML1 640 of the first emitting part 620 and the P-CGL 684 transport holes to the EML2 740 of the second emitting part 720.

The N-CGL 682 can include N-type host and N-type dopant. The N-type host can comprise an alkali metal or an alkaline earth metal such as Li, Mg and Cs and/or alkali metal compound or alkaline earth compound such as $CsCO_3$ and $CsN_3$. The N-type dopant can comprise an organic compound such as BCP, $Alq_3$, and Bphen. For example, the N-CGL 682 can comprise, but is not limited to, Cs:BCP, Mg:$Alq_3$, $CsCO_3$:$Alq_3$, Cs:Bphen, $CsN_3$:Bphen.

The P-CGL 684 can comprise metal oxide such as ITO, $V_2O_5$, $WO_3$ and $MoO_3$. Alternatively, the P-CGL 684 can comprise P-type host and P-type dopant. For example, the P-CGL 384 can comprise, but is not limited to, $FeCl_3$:NPB and tetrfluorotetracyanoquinodimethane (F4-TCNQ):NPB.

In one exemplary aspect, each of the EML1 640 and the EML2 740 can be a red emitting material layer. The inorganic luminescent particles 300 (FIG. 3) in the EML1 640 and the EML2 740 as the red emitting material layer can independently comprise, but is not limited to, InP/ZnSe, InP/ZnSeS, InP/ZnS, InP/ZnSe/ZnS, InP/ZnSeS/ZnS, CuInS/ZnSe, CuInS/ZnSeS, CuInS/ZnS, CuInS/ZnSe/ZnS and CuInS/ZnSeS/ZnS.

In another exemplary aspect, each of the EML1 640 and the EML2 740 can be a green emitting material layer. The inorganic luminescent particles 300 (FIG. 3) in the EML1 640 and the EML2 740 as the green emitting material layer can independently comprise, but is not limited to, InP/ZnSe, InP/ZnSeS, InP/ZnS, InP/ZnSe/ZnS, InP/ZnSeS/ZnS, CuInS/ZnSe, CuInS/ZnSeS, CuInS/ZnS, CuInS/ZnSe/ZnS and CuInS/ZnSeS/ZnS.

In still another exemplary aspect, each of the EML1 640 and the EML2 740 can be a blue emitting material layer. The inorganic luminescent particles 300 (FIG. 3) in the EMIL 1640 and the EML2 740 as the blue emitting material layer can independently comprise, but is not limited to, ZnSe/ZnS and ZnSeTe/ZnS.

In this case, the inorganic luminescent particles in the EML1 640 can be identical to or different from the inorganic luminescent particles in the EML2 740. The EML2 740 can emit different color or have different luminous efficiency from the EML1 640 by making the inorganic luminescent particles in the EML1 640 different from the inorganic luminescent particles in the EML2 740.

In the inorganic LED D3, each of the EML 640 and the EML2 740 includes a siloxane matrix 400 (FIG. 3) whose thickness is equal to or less than the thickness of layer of the inorganic luminescent particle 300 so that the inorganic LED D3 can lower its driving voltage and improve its luminous efficiency. In addition, since the inorganic LED D3 has a double stack structure of blue, green or red emitting material layer, the inorganic LED D3 improve its color sense or optimize its luminous efficiency.

Figure 6:
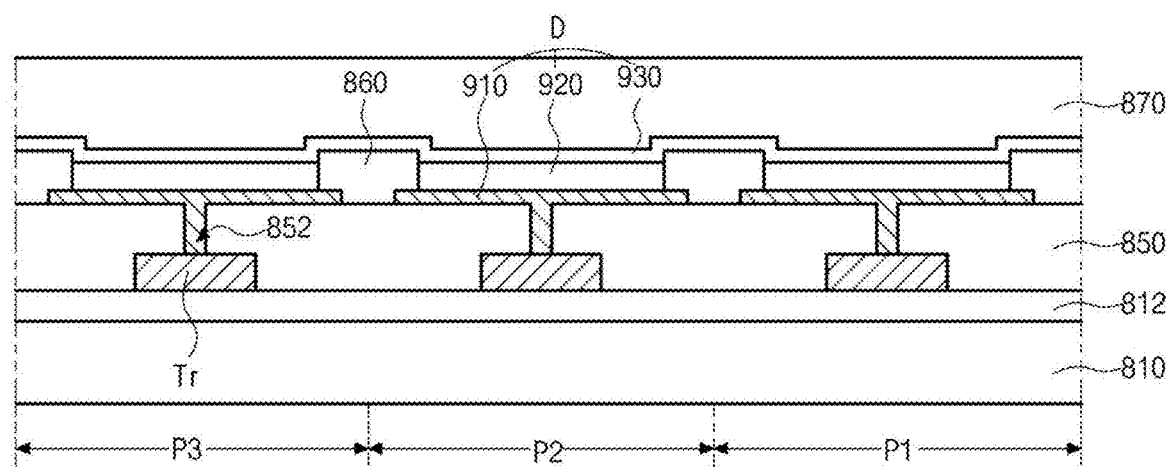
FIG. 6 is a schematic cross-sectional view illustrating an inorganic light emitting display device in accordance with another exemplary aspect of the present disclosure.

FIG. 6 is a schematic cross-sectional view illustrating an inorganic light emitting display device in accordance with another exemplary aspect of the present disclosure. As illustrated in FIG. 6, an inorganic light emitting display device 800 includes a substrate 810 that defines first to third pixel regions P1, P2 and P3, a thin film transistor Tr disposed over the substrate 810 and an inorganic LED D disposed over the thin film transistor Tr and connected to the thin film transistor Tr. As an example, the first pixel region P1 can be a blue pixel region, the second piex region P2 can be a green pixel region and the third pixel region P3 can be a red pixel region.

The substrate 810 can be a glass substrate or a flexible substrate. For example, the flexible substrate can be any one of a PI substrate, a PES substrate, a PEN substrate, a PET substrate and a PC substrate.

A buffer layer 812 is disposed over the substrate 810 and the thin film transistor Tr is disposed over the buffer layer 812. The buffer layer 812 can be omitted. As illustrated in FIG. 1, the thin film transistor Tr includes a semiconductor layer, a gate electrode, a source electrode and a drain electrode and acts as a driving element.

A passivation layer 850 is disposed over the thin film transistor Tr. The passivation layer 850 has a flat top surface and a drain contact hole 852 that exposes a drain electrode of the thin film transistor Tr.

The inorganic LED D is disposed over the passivation layer 850, and includes a first electrode 910 that is connected to the drain electrode of the thin film transistor Tr, and an emissive layer 920 and a second electrode 930 each of which is disposed sequentially on the first electrode 910. The inorganic LED D is disposed in each of the first to third pixel regions P1, P2 and P3 and emits different light in each pixel region. For example, the inorganic LED D in the first pixel region P1 can emit blue light, the inorganic LED D in the second pixel region P2 can emit green light and the inorganic LED D in the third pixel region P3 can emit red light.

The first electrode 910 is separately formed for each of the first to third pixel regions P1, P2 and P3, and the second electrode 930 corresponds to the first to third pixel regions P1, P2 and P3 and is formed integrally.

The first electrode 910 can be one of an anode and a cathode, and the second electrode 930 can be the other of the anode and the cathode. In addition, one of the first electrode 910 and the second electrode 930 is a transmissive (or semi-transmissive) electrode and the other of the first electrode 910 and the second electrode 930 is a reflective electrode.

For example, the first electrode 910 can be an anode and can include conductive material having a relatively high work function value, i.e., a transparent conductive oxide layer of transparent conductive oxide (TCO). The second electrode 930 can be a cathode and can include conductive material having relatively low work function value, i.e., a metal material layer of low-resistant metal. For example, the first electrode 910 can include undoped or doped metal oxide including ITO, IZO, ITZO, ICO, $SnO_2$, $In_2O_3$, Cd:ZnO, F;$SnO_2$, In:$SnO_2$, Ga:$SnO_2$ and AZO. Alternatively, the first electrode 910 can comprise Ni, Pt, Au, Ag, Ir and CNT in addition to the metal oxides. The second electrode 930 can include Al, Mg, Ca, Ag, alloy thereof (ex. Mg—Al) or combination thereof.

When the inorganic light emitting display device 800 is a bottom-emission type, the first electrode 910 can have a single-layered structure of a transparent conductive oxide layer.

Alternatively, when the inorganic light emitting display device 800 is a top-emission type, a reflective electrode or a reflective layer can be disposed under the first electrode 910. For example, the reflective electrode or the reflective layer can include, but is not limited to, Ag or APC alloy. In the inorganic LED D of the top-emission type, the first electrode 910 can have a triple-layered structure of ITO/Ag/ITO or ITO/APC/ITO. Also, the second electrode 930 is thin so as to have light-transmissive (or semi-transmissive) property.

A bank layer 860 is disposed over the passivation layer 850 in order to cover edges of the first electrode 910. The bank layer 860 corresponds to each of the first to third pixel regions P1, P2 and P3 and exposes a center of the first electrode 910.

An emissive layer 920 is disposed on the first electrode 910. In one exemplary aspect, the emissive layer 920 can have a single-layered structure of an EML. Alternatively, the emissive layer 920 can include at least one charge transfer layer. For example, the emissive layer 920 can further comprise at least one of a first charge transfer layer disposed between the first electrode 910 and the EML and a second charge transfer layer disposed between the second electrode 930 and the EML. Alternatively, the emissive layer can further comprise at least on exciton blocking layer 265 or 275 (FIG. 4).

In one exemplary aspect, the EML in the first pixel region P1 as the blue pixel region can comprise blue inorganic luminescent particles, the EML in the second pixel region P2 as the green pixel region can comprise green inorganic luminescent particles and the EML in the second pixel region P3 as the red pixel region can comprise red inorganic luminescent particles.

An encapsulation film 870 is disposed over the second electrode 930 in order to prevent outer moisture from penetrating into the inorganic LED D. The encapsulation film 870 can have, but is not limited to, a triple-layered structure of a first inorganic insulating film, an organic insulating film and a second inorganic insulating film.

Moreover, the inorganic light emitting display device 800 can have a polarizer in order to decrease external light reflection. For example, the polarizer can be a circular polarizer. When the inorganic light emitting display device 800 is a bottom-emission type, the polarizer can be disposed under the substrate 810. Alternatively, when the inorganic light emitting display device 800 is a top emission type, the polarizer can be disposed over the encapsulation film 870.

Figure 7:
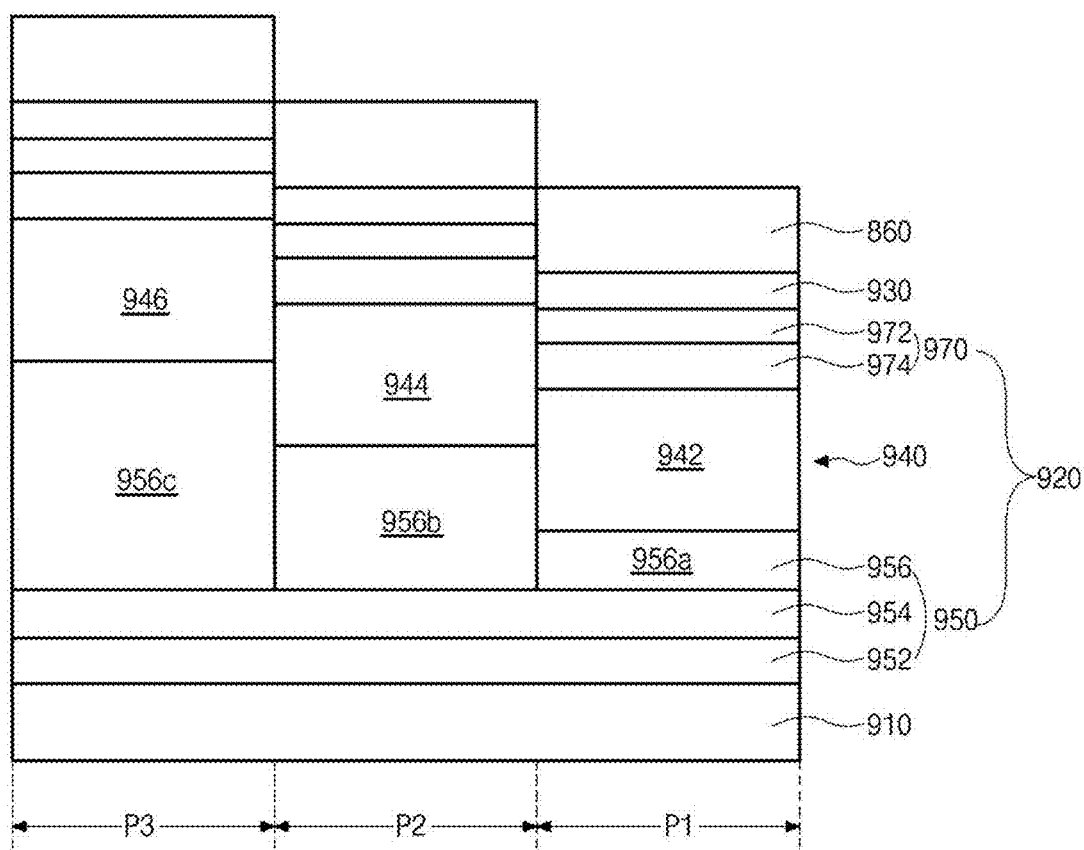
FIG. 7 is a schematic cross-section view illustrating an inorganic light emitting diode (LED) in accordance with still another exemplary aspect of the present disclosure.

FIG. 7 is a schematic cross-sectional view illustrating an inorganic LED in accordance with still another exemplary aspect of the present disclosure. As illustrated in FIG. 7, the inorganic LED D4 comprises a first electrode 910, a second electrode 930 facing the first electrode 910 and an emissive layer 920 disposed between the first and second electrodes 910 and 930.

The first electrode 910 can be an anode and the second electrode 930 can be a cathode. As an example, the first electrode 910 can be a reflective electrode and the second electrode 930 can be a transmissive (or semi-transmissive) electrode.

The emissive layer 920 comprises an EML 940. The emissive layer 930 can comprise at least one of a first charge transfer layer (hole transfer layer) 950 disposed between the first electrode 910 and the EML 940 and a second charge transfer layer (electron transfer layer) 970 disposed between the second electrode 930 and the EML 940.

In one exemplary aspect, the first charge transfer layer 950 can comprise a HIL 952 disposed between the first electrode 910 and the EML 940 and a HTL 954 disposed between the EML 940 and the HIL 952. Alternatively, the HIL 952 can be omitted.

In one exemplary aspect, the second charge transfer layer 970 can comprise an EIL 972 disposed between the second electrode 930 and the EML 940 and an ETL 974 disposed between the EML 940 and the EIL 972. Alternatively, the EIL 972 can be omitted.

In addition, the first charge transfer layer 940 can further comprise an auxiliary hole transport layer (auxiliary HTL) 956 disposed between the EML 940 and the HTL 954. The auxiliary HTL 956 can comprise a first auxiliary HTL 956a located in the first pixel region P1, a second auxiliary HTL 956b located in the second pixel region P2 and a third auxiliary HTL 956c located in the third pixel region P3.

The first auxiliary HTL 956a has a first thickness, the second auxiliary HTL 956b has a second thickness and the third auxiliary HTL 956c has a third thickness. The first thickness is less than the second thickness, and the second thickness is less than the third thickness. Accordingly, the inorganic LED D4 has a micro-cavity structure.

Owing to the first to third auxiliary HTLs 956a, 956b and 956c having different thickness to each other, the distance between the first electrode 910 and the second electrode 930 in the first pixel region P1 emitting light in the first wavelength range (blue light) is less than the distance between the first electrode 910 and the second electrode 930 in the second pixel region P2 emitting light in the second wavelength (green light). In addition, the distance between the first electrode 910 and the second electrode 930 in the second pixel region P2 emitting light in the second wavelength is less than the distance between the first electrode 910 and the second electrode 930 in the third pixel region P3 emitting light in the third wavelength range (red light). Accordingly, the inorganic LED D3 has improved luminous efficiency.

In FIG. 7, the first auxiliary HTL 956a is located in the first pixel region P1. Alternatively, the inorganic LED D4 can implement the micro-cavity structure without the first auxiliary HTL 956a. In addition, a capping layer can be disposed over the second electrode in order to improve out-coupling of the light emitted from the inorganic LED D4.

The EML 940 comprises a first EML (EML1) 942 located in the first pixel region P1, a second EML (EML2) 944 located in the second pixel region P2 and a third EML (EML3) 946 located in the third pixel region P3. Each of the EML1 942, the EML2 944 and the EML3 946 can be a blue EML, a green EML and a red EML, respectively. The EML1 942 can comprise blue inorganic luminescent particles, the EML2 944 can comprise green inorganic luminescent particles and the EML3 946 can comprise red inorganic luminescent particles.

The inorganic LED D4 emits blue light, green light and red light in each of the first to third pixel regions P1, P2 and P3 so that the inorganic light emitting display device 800 (FIG. 6) can implement a full-color image.

The inorganic light emitting display device 800 can further comprise a color filter layer corresponding to the first to third pixel regions P1, P2 and P3 for improving color purity of the light emitted from the inorganic LED D. As an example, the color filter layer can comprise a first color filter layer (blue color filter layer) corresponding to the first pixel region P1, the second color filter layer (green color filter layer) corresponding to the second pixel region P2 and the third color filter layer (red color filter layer) corresponding to the third pixel region P3.

When the inorganic light emitting display device 800 is a bottom-emission type, the color filter layer can be disposed between the inorganic LED D and the substrate 810. Alternatively, when the inorganic light emitting display device 800 is a top-emission type, the color filter layer can be disposed over the inorganic LED D.

Figure 8:
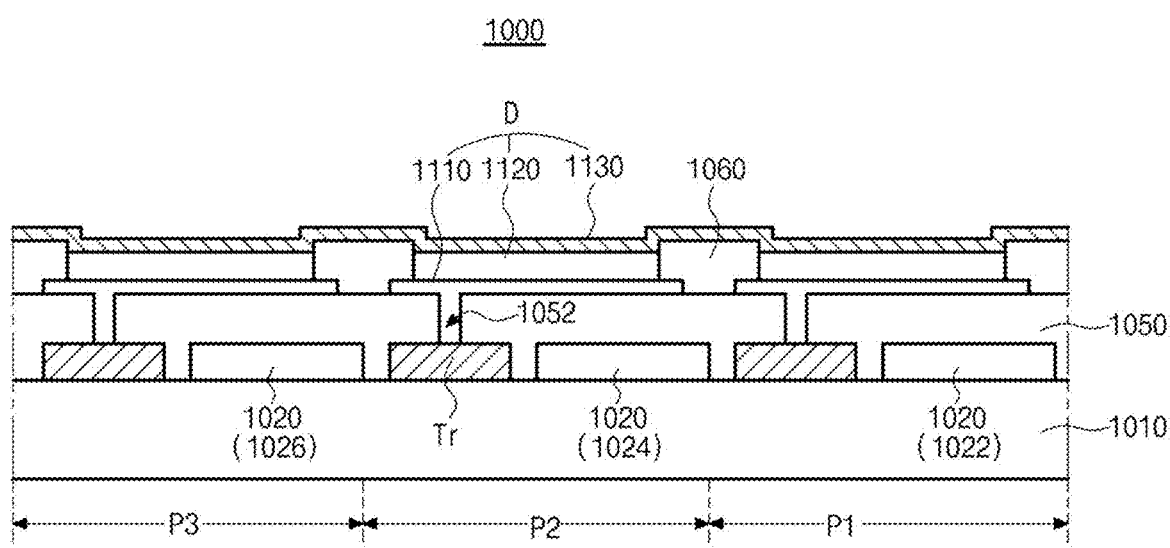
FIG. 8 is a schematic cross-sectional view illustrating an inorganic light emitting display device in accordance with still another exemplary aspect of the present disclosure.

FIG. 8 is a schematic cross-sectional view illustrating an inorganic light emitting display device in accordance with still another exemplary aspect of the present disclosure. As illustrated in FIG. 8, the inorganic light emitting display device 1000 comprise a substrate 1010 defining a first pixel region P1, a second pixel region P2 and a third pixel region P3, a thin film transistor Tr disposed over the substrate 1010, an inorganic LED D disposed over the thin film transistor Tr and connected to the thin film transistor Tr and a color filter layer 1020 corresponding to the first to third pixel regions P1, P2 and P3. As an example, the first pixel region P1 can be a blue pixel region, the second pixel region P2 can be a green pixel region and the third pixel region P3 can be a red pixel region.

The substrate 1010 can be a glass substrate or a flexible substrate. For example, the flexible substrate can be any one of a PI substrate, a PES substrate, a PEN substrate, a PET substrate and a PC substrate. The thin film transistor Tr is located over the substrate 1010. Alternatively, a buffer layer can be disposed over the substrate 1010 and the thin film transistor Tr can be disposed over the buffer layer. As illustrated in FIG. 1, the thin film transistor Tr includes a semiconductor layer, a gate electrode, a source electrode and a drain electrode and acts as a driving element.

The color filter layer 1020 is located over the substrate 1010. As an example, the color filter layer 1020 can comprise a first color filter layer 1022 corresponding to the first pixel region P1, a second color filter layer 1024 corresponding to the second pixel region P2 and a third color filter layer 1026 corresponding to the third pixel region P3. The first color filter layer 1022 can be a blue color filter layer, the second color filter layer 1024 can be a green color filter layer and the third color filter layer 1026 can be a red color filter layer. For example, the first color filter layer 1022 can comprise at least one of blue dye or blue pigment, the second color filter layer 1024 can comprise at least one of green dye or green pigment and the third color filter layer 1026 can comprise at least one of red dye or red pigment.

A passivation layer 1050 is disposed over the thin film transistor Tr and the color filter layer 1020. The passivation layer 1050 has a flat top surface and a drain contact hole 1052 that exposes a drain electrode of the thin film transistor Tr.

The inorganic LED D is disposed over the passivation layer 1050 and corresponds to the color filter layer 1020. The inorganic LED D includes a first electrode 1110 that is connected to the drain electrode of the thin film transistor Tr, and an emissive layer 1120 and a second electrode 1130 each of which is disposed sequentially on the first electrode 1110. The inorganic LED D emits white light in the first to third pixel regions P1, P2 and P3.

The first electrode 1110 is separately formed for each of the first to third pixel regions P1, P2 and P3, and the second electrode 1130 corresponds to the first to third pixel regions P1, P2 and P3 and is formed integrally.

The first electrode 1110 can be one of an anode and a cathode, and the second electrode 1130 can be the other of the anode and the cathode. In addition, the first electrode 1110 can be a transmissive (or semi-transmissive) electrode and the second electrode 1130 can be a reflective electrode.

For example, the first electrode 1110 can be an anode and can include conductive material having a relatively high work function value, i.e., a transparent conductive oxide layer of transparent conductive oxide (TCO). The second electrode 1130 can be a cathode and can include conductive material having relatively low work function value, i.e., a metal material layer of low-resistant metal. For example, the transparent conductive oxide layer of the first electrode 1110 can include undoped or doped metal oxide including ITO, IZO, ITZO, ICO, $SnO_2$, $In_2O_3$, Cd:ZnO, F;$SnO_2$, In:$SnO_2$, Ga:$SnO_2$ and AZO. Alternatively, the first electrode 910 can comprise Ni, Pt, Au, Ag, Ir and CNT in addition to the metal oxides. The second electrode 930 can include Al, Mg, Ca, Ag, alloy thereof (ex. Mg—Al) or combination thereof.

The emissive layer 1120 is disposed on the first electrode 1110. The emissive layer 1120 includes at least two emitting parts emitting different colors. Each of the emitting part can have a single-layered structure of an EML. Alternatively, each of the emitting parts can include at least one of a hole transfer layer and an electron transfer layer, and optionally at least one exciton blocking layer. In addition, the emissive layer 1120 can further comprise a CGL disposed between the emitting parts.

At least one of the at least two emitting parts can be a blue EML and the other of the at least two emitting parts can be an EML emitting light whose wavelength is longer than the blue light.

A bank layer 1060 is disposed on passivation layer 1050 in order to cover edges of the first electrode 1110. The bank layer 1060 corresponds to each of the first to third pixel regions P1, P2 and P3 and exposes a center of the first electrode 1110. As described above, since the inorganic LED D emits white light in the first to third pixel regions P1, P2 and P3, the emissive layer 1120 can be formed as a common layer without being separated in the first to third pixel regions P1, P2 and P3. The bank layer 1060 is formed to prevent current leakage from the edges of the first electrode 1110, and the bank layer 1060 can be omitted.

Moreover, the inorganic light emitting display device 1000 can further comprise an encapsulation film disposed on the second electrode 1130 in order to prevent outer moisture from penetrating into the OLED D. In addition, the organic light emitting display device 1000 can further comprise a polarizer disposed under the substrate 1010 in order to decrease external light reflection.

In the inorganic light emitting display device 1000 in FIG. 8, the first electrode 1110 is a transmissive electrode, the second electrode 1130 is a reflective electrode, and the color filter layer 1020 is disposed between the substrate 1010 and the inorganic LED D. That is, the inorganic light emitting display device 1000 is a bottom-emission type. Alternatively, the first electrode 1110 can be a reflective electrode, the second electrode 1120 can be a transmissive electrode (or semi-transmissive electrode) and the color filter layer 1020 can be disposed over the inorganic LED D in the organic light emitting display device 1000.

In the inorganic light emitting display device 1000, the inorganic LED D located in the first to third pixel regions P1, P2 and P3 emits white light, and the white light passes through each of the first to third pixel regions P1, P2 and P3 so that each of a blue color, a green color and a red color is displayed in the first to third pixel regions P1, P2 and P3, respectively.

A color conversion film can be disposed between the inorganic LED D and the color filter layer 1020. The color conversion film corresponds to the first to third pixel regions P1, P2 and P3, and comprises a blue color conversion film, a green color conversion film and a red color conversion film each of which can convert the white light emitted from the inorganic LED D into blue light, green light and red light, respectively. For example, the color conversion film can comprise quantum dots. Accordingly, the organic light emitting display device 1000 can further enhance its color purity. Alternatively, the color conversion film can displace the color filter layer 1020.

Figure 9:
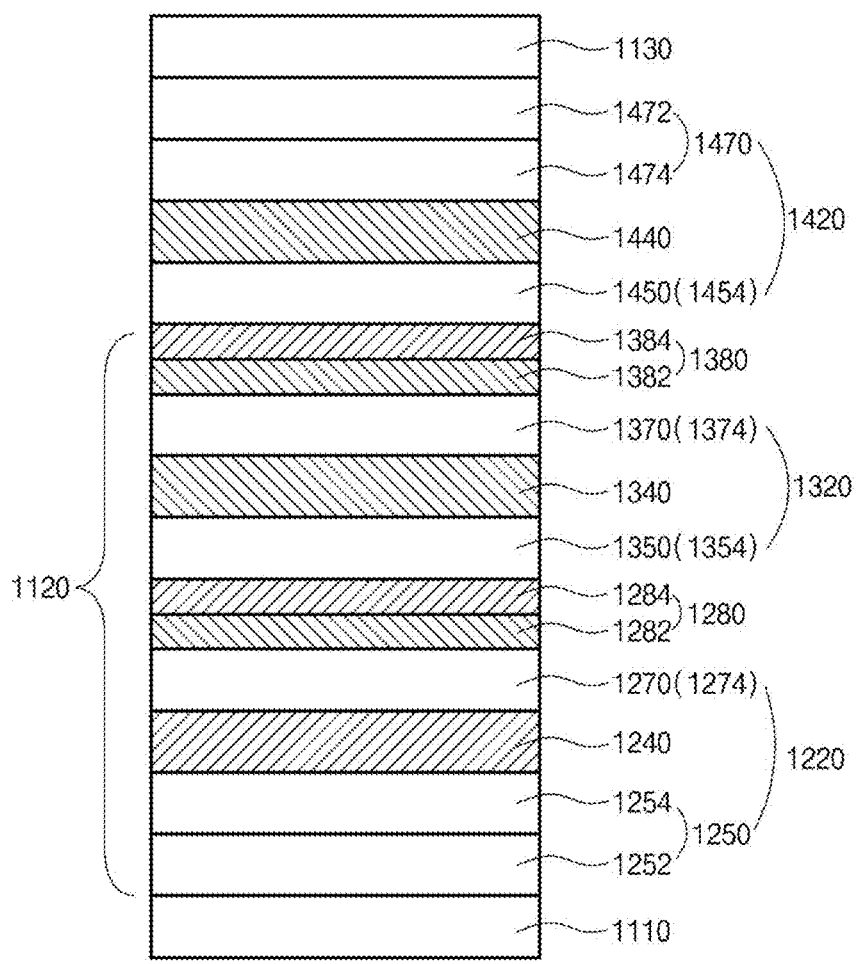
FIG. 9 is a schematic cross-sectional view illustrating an inorganic light emitting display device in accordance with another exemplary aspect of the present disclosure.

FIG. 9 is a schematic cross-sectional view illustrating an inorganic LED in accordance with still another exemplary aspect of the present disclosure. As illustrated in FIG. 9, the inorganic LED D5 comprises first and second electrodes 1110 and 1120 facing each other and an emissive layer 1120 disposed between the first and second electrodes 1110 and 1120. The first electrode 1110 can be an anode and the second electrode 1120 can be a cathode. For example, the first electrode 1100 can be a transmissive electrode and the second electrode 1120 can be a reflective electrode.

The emissive layer 1120 includes a first emitting part 1220 comprising a first EML (EML1) 1240, a second emitting part 1320 comprising a second EML (EML2) 1340 and a third emitting part 1420 comprising a third EML (EML3) 1440. In addition, the emissive layer 1120 can further comprise a first charge generation layer (CGL1) 1280 disposed between the first emitting part 1220 and the second emitting part 1320 and a second charge generation layer (CGL2) 1380 disposed between the second emitting part 1320 and the third emitting part 1420. Accordingly, the first emitting part 1220, the CGL1 1280, the second emitting part 1320, the CGL2 1380 and the third emitting part 1420 are disposed sequentially on the first electrode 1110.

The first emitting part 1220 comprise the EML1 1240. The first emitting part 1220 can further comprise at least one of a lower first charge transfer layer (first hole transfer layer) 1250 disposed between the first electrode 1110 and the EML1 1240 and a lower second charge transfer layer (first electron transfer layer) 1270 disposed between the EML1 1240 and the CGL1 1280. In one exemplary aspect, the lower first charge transfer layer 1250 can comprise a HIL 1252 disposed between the first electrode 1110 and the EML1 1240 and a HTL1 1254 disposed between the EML1 1240 and the HIL 1252. Alternatively, the first hole transfer layer 1250 can have a single-layered structure of the HTL 1 1254. The first electron transfer layer 1270 can have a single-layered structure of an ETL 1 1274. Alternatively, the first emitting part 1220 can further comprise an EBL1 disposed between the EML1 1240 and the first hole transfer layer 1250 and/or a HBL1 disposed between the EML1 1240 and the first electron transfer layer 1270.

The second emitting part 1320 comprises the EML2 1340. The second emitting part 1320 can comprise at least one of a middle first charge transfer layer (second hole transfer layer) 1350 disposed between the CGL1 1280 and the EML2 1340 and a middle second charge transfer layer (second electron transfer layer) 1370 disposed between the EML2 1340 and the CGL2 1380. As an example, the second hole transfer layer 1350 can have a single-layered structure of a HTL2 1354. The second electron transfer layer 1370 can have a single-layered structure of an ETL2 1374. Alternatively, the second emitting part 1320 can further comprise an EBL2 disposed between the EML2 1340 and the second hole transfer layer 1350 and/or a HBL2 disposed between the EML2 1340 and the second electron transfer layer 1370.

The third emitting part 1420 comprises the EML3 1440. The third emitting part 1420 can comprise at least one of an upper first charge transfer layer (third hole transfer layer) 1450 disposed between the CGL2 1380 and the EML3 1440 and an upper second charge transfer layer (third electron transfer layer) 1470 disposed between the second electrode 1130 and the EML3 1440. The third hole transfer layer 1450 can have a single-layered structure of a third HTL (HTL3) 1454. In one exemplary aspect, the third electron transfer layer 1470 can comprise an EIL 1472 and a third ETL (ETL3) 1474 each of which is disposed sequentially between the second electrode 1130 and the EML3 1440. Alternatively, the third electron transfer layer 1470 can have a single-layered structure of the ETL3 1474. Alternatively, the third emitting part 1420 can further comprise a third EBL (EBL3) disposed between the EML3 1440 and the third hole transfer layer 1450 and/or a third HBL (HBL3) disposed between the EML3 1440 and the third electron transfer layer 1470.

The CGL1 1280 is disposed between the first emitting part 1220 and the second emitting part 1320. That is, the first emitting part 1220 and the second emitting part 1320 are connected via the CGL1 1280. The CGL1 1280 can be a PN-junction CGL that junctions a first N-type CGL (N-CGL1) 1282 with a first P-type CGL (P-CGL1) 1284.

The N-CGL1 1282 is disposed between the first electron transfer layer 1270 and the second hole transfer layer 1350 and the P-CGL1 1284 is disposed between the N-CGL1 1282 and the second hole transfer layer 1450. The N-CGL1 1282 transports electrons to the EML1 1240 of the first emitting part 1220 and the P-CGL1 1284 transport holes to the EML2 1340 of the second emitting part 1320.

The CGL2 1380 is disposed between the second emitting part 1320 and the third emitting part 1420. That is, the second emitting part 1320 and the third emitting part 1420 are connected via the CGL2 1380. The CGL2 1380 can be a PN-junction CGL that junctions a second N-type CGL (N-CGL2) 1382 with a second P-type CGL (P-CGL2) 1384.

The N-CGL2 1382 is disposed between the second electron transfer layer 370 and the third hole transfer layer 1450 and the P-CGL2 1384 is disposed between the N-CGL2 1382 and the third hole transfer layer 1450. The N-CGL2 1382 transports electrons to the EML2 1340 of the second emitting part 1320 and the P-CGL2 1384 transport holes to the EML3 1440 of the third emitting part 1420.

In this aspect, one of the first to third EMLs 1240, 1340 and 1440 can be a blue EML, another of the first to third EMLs 1240, 1340 and 1440 can be a green EML and the third of the first to third EMLs 1240, 1340 and 1440 can be a red EML.

As an example, the EML1 1240 can be a blue EML, the EML2 1340 can be a green EML and the EML3 1440 can be a red EML. Alternatively, the EML1 1240 can be a red EML, the EML2 1340 can be a green EML and the EML3 1440 can be a blue EML1. Hereinafter, the OLED D5 where the EML1 1240 is a blue EML, the EML2 1340 is a green EML and the EML3 1440 is a red EML will be described.

The EML1 1240 can comprise blue inorganic luminescent particles. The blue inorganic luminescent particles can comprise, but is not limited to, ZnSe/ZnS and ZnSeTe/ZnS. The EML2 1340 can comprise green inorganic luminescent particles. The green inorganic luminescent particles can comprise, but is not limited to, InP/ZnSe, InP/ZnSeS, InP/ZnS, InP/ZnSe/ZnS, InP/ZnSeS/ZnS, CuInS/ZnSe, CuInS/ZnSeS, CuInS/ZnS, CuInS/ZnSe/ZnS and CuInS/ZnSeS/ZnS. The EML3 1440 can comprise red inorganic luminescent particles. The red inorganic luminescent particles can comprise, but is not limited to, InP/ZnSe, InP/ZnSeS, InP/ZnS, InP/ZnSe/ZnS, InP/ZnSeS/ZnS, CuInS/ZnSe, CuInS/ZnSeS, CuInS/ZnS, CuInS/ZnSe/ZnS and CuInS/ZnSeS/ZnS.

The inorganic LED D5 emits white light in each of the first to third pixel regions P1, P2 and P3 and the white light passes though the color filter layer 1020 (FIG. 8) correspondingly disposed in the first to third pixel regions P1, P2 and P3. Accordingly, the inorganic light emitting display device 1000 (FIG. 8) can implement a full-color image.

Figure 10:
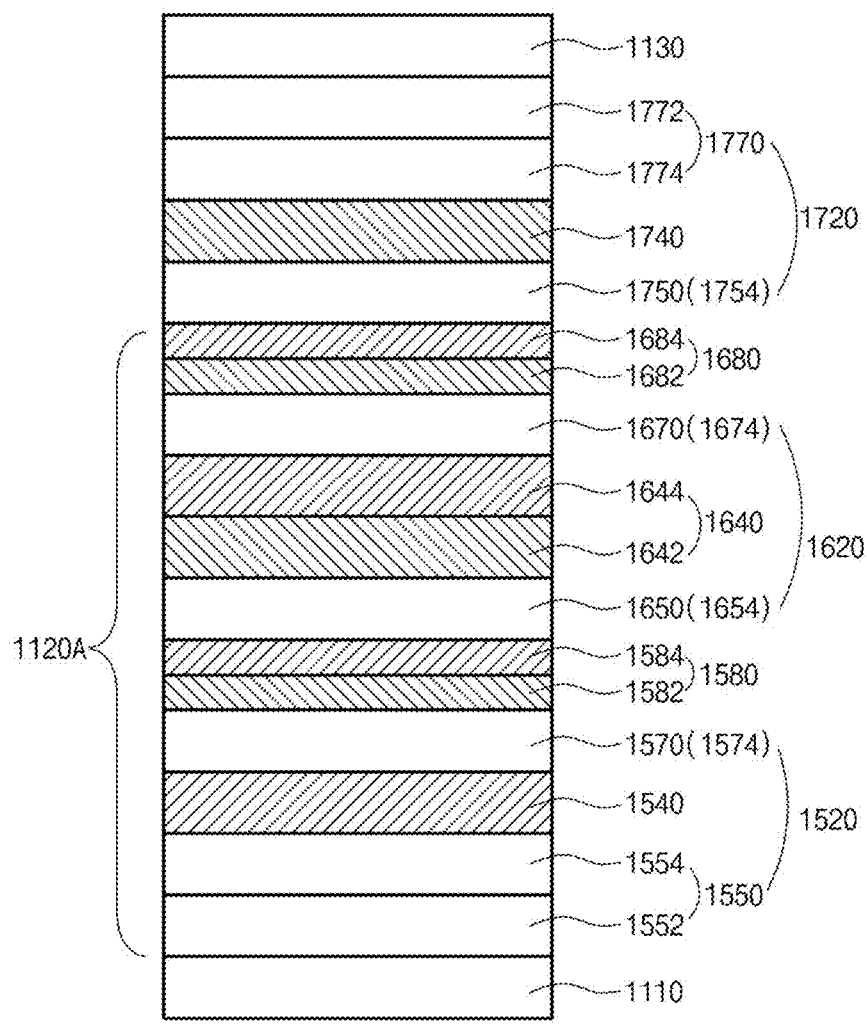
FIG. 10 is a schematic cross-section view illustrating an inorganic light emitting diode (LED) in accordance with still another exemplary aspect of the present disclosure.
Figure 11:
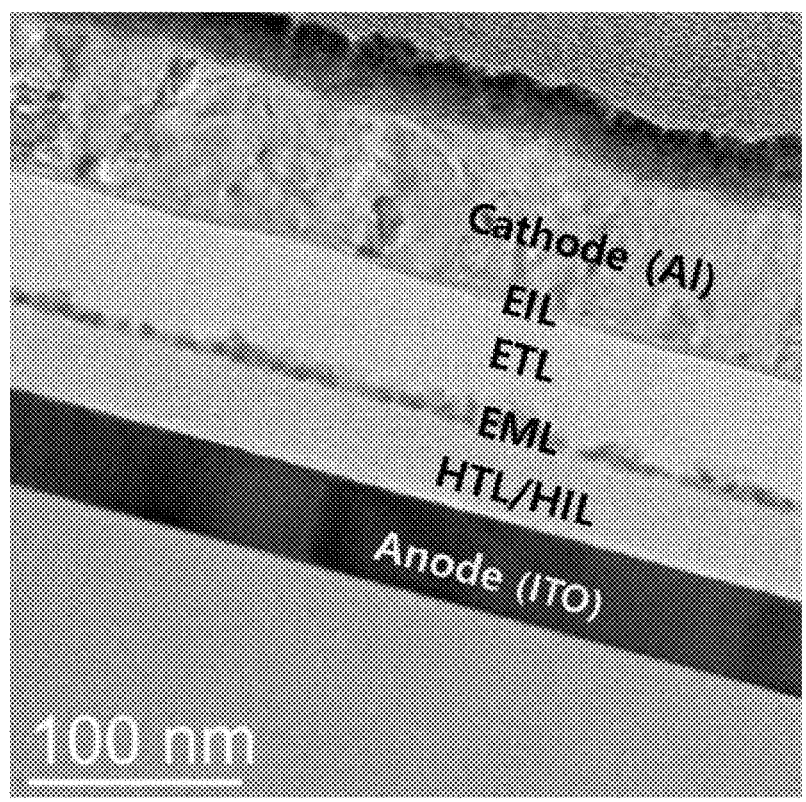
FIG. 11 is a TEM image illustrating a cross-section of an inorganic LED fabricated in accordance with an Example of the present disclosure.

FIG. 10 is a schematic cross-sectional view illustrating an inorganic LED in accordance with still another exemplary aspect of the present disclosure. As illustrated in FIG. 10, the inorganic LED D6 comprises first and second electrodes 1110 and 1120 facing each other and an emissive layer 1120A disposed between the first and second electrodes 1110 and 1120. The first electrode 1110 can be an anode and the second electrode 1120 can be a cathode. For example, the first electrode 1100 can be a transmissive electrode and the second electrode 1120 can be a reflective electrode.

The emissive layer 1120A includes a first emitting part 1520 comprising a first EML (EML1) 1540, a second emitting part 1620 comprising a second EML (EML2) 1640 and a third emitting part 1720 comprising a third EML (EML3) 1740. In addition, the emissive layer 1120A can further comprise a CGL1 1580 disposed between the first emitting part 1520 and the second emitting part 1620 and a CGL2 1680 disposed between the second emitting part 1620 and the third emitting part 1720. Accordingly, the first emitting part 1520, the CGL1 1580, the second emitting part 1620, the CGL2 1680 and the third emitting part 1720 are disposed sequentially on the first electrode 1110.

The first emitting part 1520 comprise the EML1 1540. The first emitting part 1520 can further comprise at least one of a lower first charge transfer layer (first hole transfer layer) 1550 disposed between the first electrode 1110 and the EML1 1540 and a lower second charge transfer layer (first electron transfer layer) 1570 disposed between the EML1 1540 and the CGL1 1580. In one exemplary aspect, the first hole transfer layer 1550 can comprise a HIL 1552 disposed between the first electrode 1110 and the EML1 1540 and a HTL1 1554 disposed between the EML1 1540 and the HIL 1552. Alternatively, the first hole transfer layer 1550 can have a single-layered structure of the HTL1 1554. The first electron transfer layer 1570 can have a single-layered structure of an ETL 1 1574. Alternatively, the first emitting part 1520 can further comprise an EBL1 disposed between the EML1 1540 and the first hole transfer layer 1550 and/or HBL1 disposed between the EML1 1540 and the first electron transfer layer 1570.

The second emitting part 1620 comprises the EML2 1640. The EML2 1640 comprise a lower EML 1642 and an upper EML 1644. The lower EML 1642 is disposed adjacently to the first electrode 1110 and the upper EML 1644 is disposed adjacently to the second electrode 1130. The second emitting part 1620 can comprise at least one of a middle first charge transfer layer (second hole transfer layer) 1650 disposed between the CGL1 1580 and the EML2 1640 and a middle second charge transfer layer (second electron transfer layer) 1570 disposed between the EML2 1640 and the CGL2 1680. As an example, the second hole transfer layer 1650 can have a single-layered structure of a HTL2 1654. The second electron transfer layer 1670 can have a single-layered structure of an ETL2 1674. Alternatively, the second emitting part 1620 can further comprise an EBL2 disposed between the EML2 1640 and the second hole transfer layer 1650 and/or a HBL2 disposed between the EML2 1640 and the second electron transfer layer 1670.

The third emitting part 1720 comprises the EML3 1740. The third emitting part 1720 can comprise at least one of an upper first charge transfer layer (third hole transfer layer) 1750 disposed between the CGL2 1680 and the EML3 1740 and an upper second charge transfer layer (third electron transfer layer) 1770 disposed between the second electrode 1130 and the EML3 1740. The third hole transfer layer 1750 can have a single-layered structure of a HTL3 1754. In one exemplary aspect, the third electron transfer layer 1770 can comprise an EIL 1772 and an ETL3 1774 each of which is disposed sequentially between the second electrode 1130 and the EML3 1740. Alternatively, the third electron transfer layer 1770 can have a single-layered structure of the ETL3 1774. Alternatively, the third emitting part 1720 can further comprise an EBL3 disposed between the EML3 1740 and the third hole transfer layer 1750 and/or a HBL3 disposed between the EML3 1740 and the third electron transfer layer 1770.

The CGL1 1680 is disposed between the first emitting part 1520 and the second emitting part 1620. That is, the first emitting part 1520 and the second emitting part 1620 are connected via the CGL1 1580. The CGL1 1580 can be a PN-junction CGL that junctions an N-CGL1 1582 with a P-CGL1 1584. The N-CGL1 1582 is disposed between the first electron transfer layer 1570 and the second hole transfer layer 1650 and the P-CGL1 1584 is disposed between the N-CGL1 1582 and the second hole transfer layer 1650.

The CGL2 1680 is disposed between the second emitting part 1620 and the third emitting part 1720. That is, the second emitting part 1620 and the third emitting part 1720 are connected via the CGL2 1680. The CGL2 1680 can be a PN-junction CGL that junctions an N-CGL2 1682 with a P-CGL2 1684. The N-CGL2 1682 is disposed between the second electron transfer layer 1670 and the third hole transfer layer 1750 and the P-CGL2 1684 is disposed between the N-CGL2 1682 and the third hole transfer layer 1750.

In this aspect, each of the EML1 1540 and the EML3 1740 can be a blue EML, respectively. In one exemplary aspect, each of the EML1 1540 and the EML3 1740 can comprise blue inorganic luminescent particles. The blue inorganic luminescent particles in the EML1 1540 can be identical to or different from the blue inorganic luminescent particles in the EML3 1740. The EML3 1740 can emit different color or have different luminous efficiency from the EML1 1540 by making the inorganic luminescent particles in the EML 1540 different from the inorganic luminescent particles in the EML3 1740.

One of the lower EML 1642 and the upper EML 1644 in the EML2 1640 can be a green EML and the other of the lower EML 1642 and the upper EML 1644 in the EML2 1640 can be a red EML. The green EML and the red EML is sequentially disposed to form the EML2 1640.

In one exemplary aspect, the lower EML 1642 as the green EML can comprise green inorganic luminescent particles and the upper EML 1644 as the red EML can comprise red inorganic luminescent particles.

Alternatively, the EML2 1640 can have a single-layered structure to emit yellow light. In this case, the size of the green inorganic luminescent particles and the/or the red inorganic luminescent particles are adjusted so that the EML2 1640 can emit yellow wavelength light.

The OLED D6 emits white light in each of the first to third pixel regions P1, P2 and P3 and the white light passes though the color filter layer 1020 (FIG. 8) correspondingly disposed in the first to third pixel regions P1, P2 and P3. Accordingly, the inorganic light emitting display device 1000 (FIG. 8) can implement a full-color image.

In FIG. 10, the OLED D6 has a three-stack structure including the first to three emitting parts 1520, 1620 and 1720 which includes the EML1 1540 and the EML3 1740 as a blue EML. Alternatively, the OLED D6 can have a two-stack structure where one of the first emitting part 1520 and the third emitting part 1720 each of which includes the EML1 1540 and the EML3 1740 as a blue EML is omitted.

Example 1 (Ex. 1): Fabrication of QLED

A quantum light emitting diode (QLED) in which red quantum dots (InP/ZnSe/ZnS; average size 10 nm) are tetraethyl silicate (TEOS) matrix as a siloxane material was fabricated. The red quantum dots (6 mg/mL) and TEOS mixed with a volume ratio of 1:0.1 were dispersed in octane in a Glove box.

An ITO (50 nm)-glass was patterned to have luminous area 3 mm×3 mm and washed. And an emissive layer and cathode were laminated as the following order:

A HIL (PEDOT:PSS, spin coating (5000 rpm, 60 second) in water base, and heating (200° C., 15 minutes), 20 nm); a HTL (PVK (4 mg/IL in toluene), spin coating (3000 rpm, 60 seconds) and heating (230° C., 30 minutes), 20 nm); an EML (red QD InP/ZnSe/ZnS having oleic acid ligand (6 mg/mL): TEOS=1:0.1 by volume ratio in octane, spin coating (3000 rpm), 10 nm); an ETL (pyridine-based ETL material ET-048, the substrate was mounted to a deposition chamber, condensed at 102 base pressure for 12 second, and deposited under 102 torr of base pressure in a deposition chamber, 54 nm); an EIL (LiF, 1.2 nm); and cathode (Al, deposited in a metal chamber, 80-100 nm).

After a capping layer (CPL) was deposited on the cathode, the QLED was encapsulated with glass. And then, the QLED was transferred to a dry box for film formation, followed by encapsulation using UV-curable epoxy and moisture getter.

Example 2 (Ex. 2): Fabrication of QLED

A QLED was fabricated using the same materials as Example 1, except modifying the volume ratio of the red quantum dots and TEOS to 1:1 in the EML.

Comparative Example 1 (Ref 1): Fabrication of QLED

A QLED was fabricated using the same materials as Example 1, except modifying the volume ratio of the red quantum dots and TEOS to 1:5.

Comparative Example 2 (Ref 2): Fabrication of QLED

A QLED was fabricated using the same materials as Example 1, except forming the EML with only the red quantum dots without mixing TEOS.

Experimental Example 1: Analysis of Structural Shape of QLED

Figure 12A:
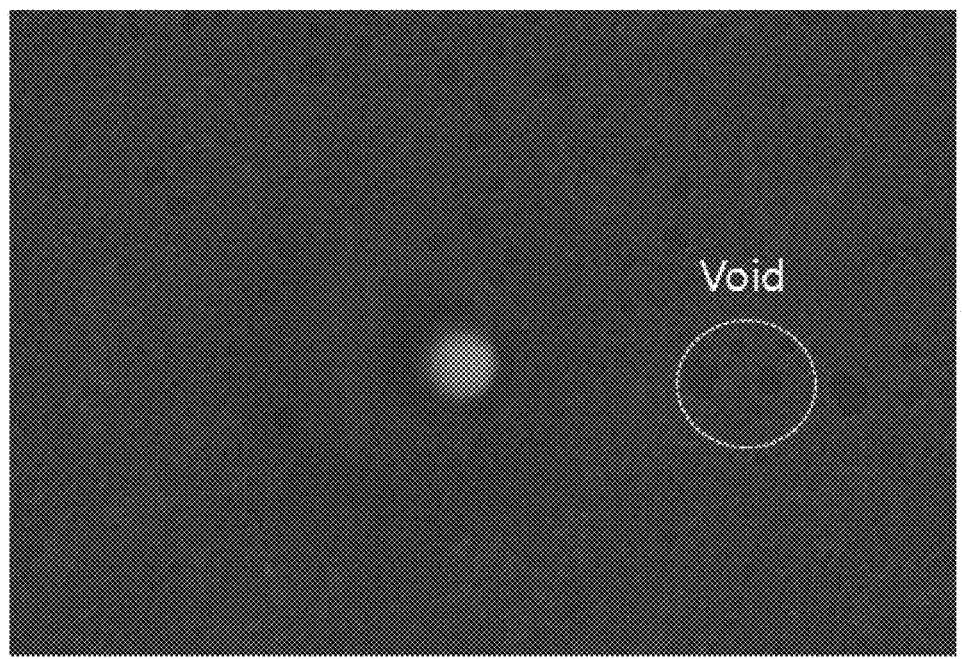
FIGS. 12A and 12B are TEM images illustrating a top or a cross-sectional of an inorganic LED fabricated in a Comparative Example.
Figure 12B:
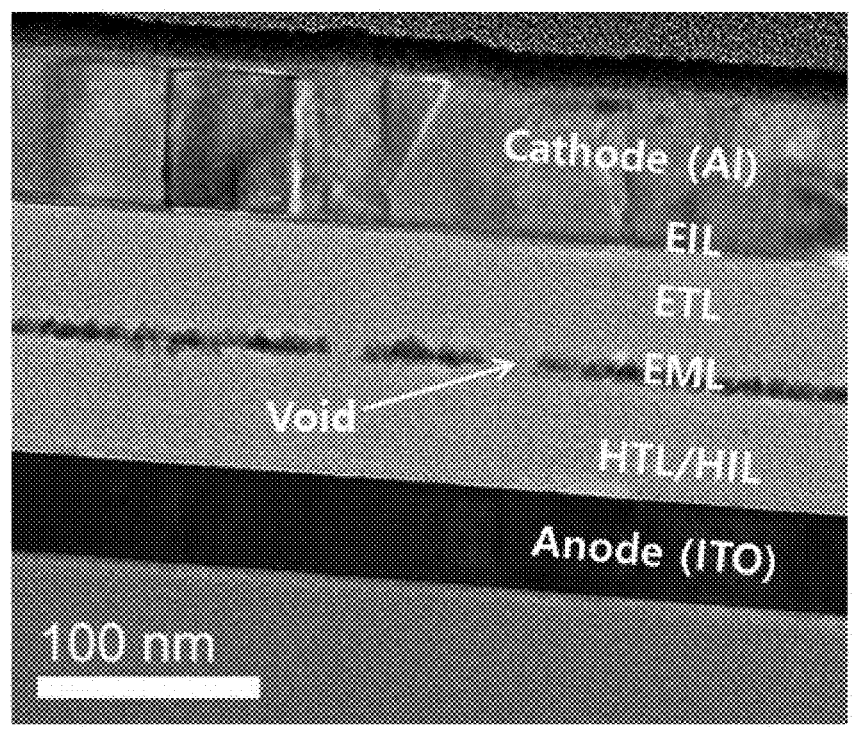

Structural shapes of the QLED fabricated in Ex. 2 and Ref 2 were analyzed using TEM. FIG. 5 is a TEM image illustrating a cross-section of an inorganic LED fabricated in Ex. 2. FIGS. 6A and 6B are TEM images illustrating a top or a cross-sectional of an inorganic LED fabricated in Ref 2. As illustrated in FIGS. 12A and 12B, as the organic ligand bonded to outer surface of the quantum dots is detached, surface defects are caused, and therefore, voids are formed in the EML with only the quantum dots. On the contrary, as illustrated in FIG. 5, when quantum dots are dispersed in or mixed with the siloxane matrix, voids are not formed in the EML as the siloxane matrix protects the quantum dots.

Experimental Example 2: STEM-EDS Analysis of QLED

STEM-EDS (scanning transmission electron microscopy-energy dispersive X-ray spectroscopy) measurement was performed to analysis elements in the QLEDs fabricated in Ex. 1-2 and Ref. 1. In order to analysis elements in the EML, zinc which is one of the element constituting the outmost shell of the quantum dots and silicon constituting the siloxane matrix were analyzed.

Figure 13A:
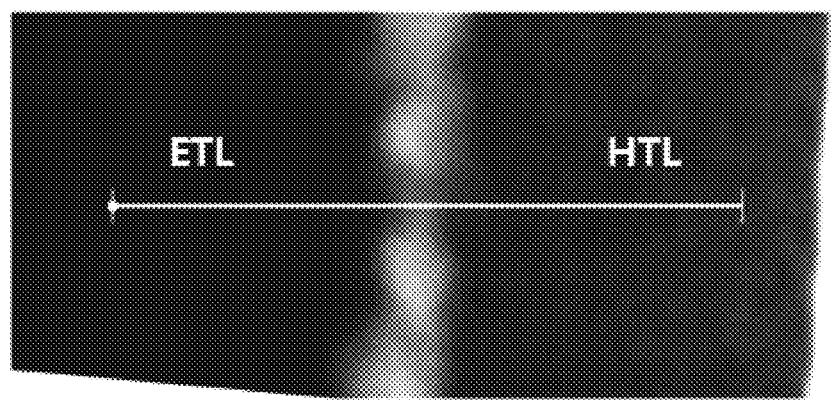
FIGS. 13A to 13C illustrate measurement results by STEM-EDS for the inorganic LED fabricated in accordance with an Example of the present disclosure, where
Figure 13B:
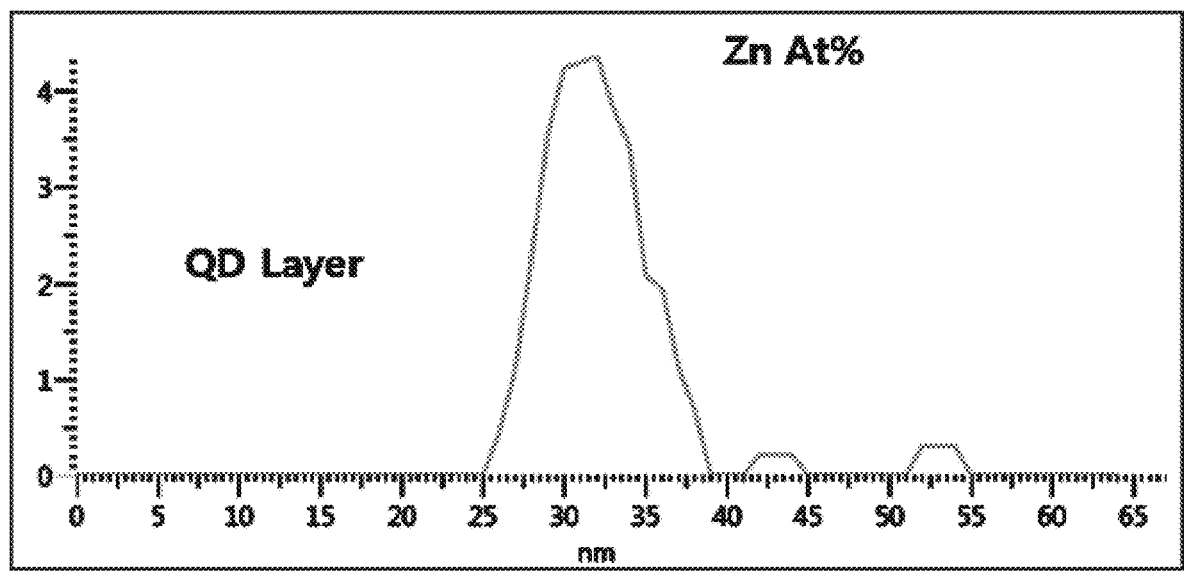
Figure 13C:
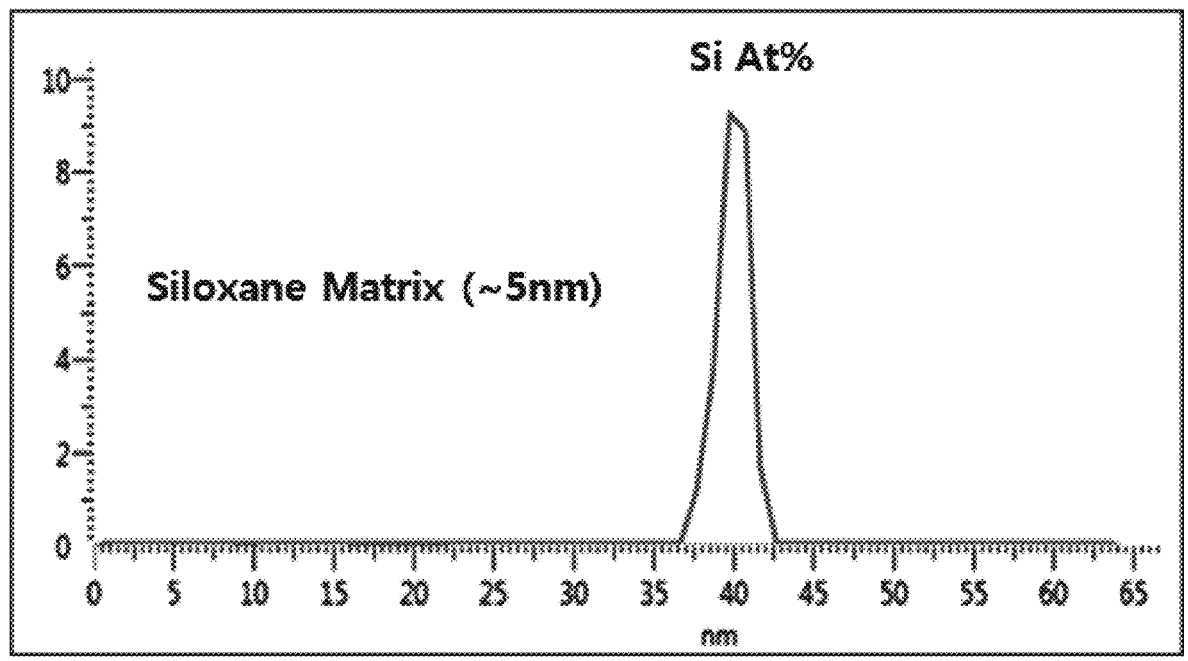

As illustrated in FIGS. 13A to 13C, silicon was observed in a HTL adjacent area of the whole EML in the QLED fabricated in Ex. 1 and siloxane matrix covered about a third of the total thickness of the quantum dot layer in the EML.

Figure 14A:
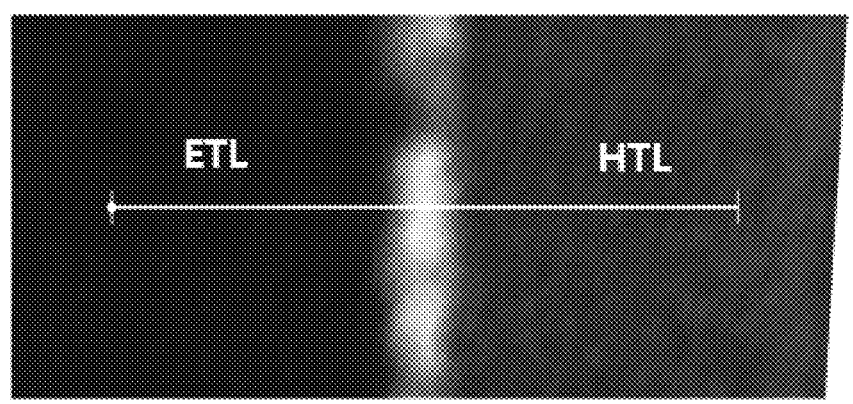
FIGS. 14A to 14C illustrate measurement results by STEM-EDS for the inorganic LED fabricated in accordance with another Example of the present disclosure, where
Figure 14B:
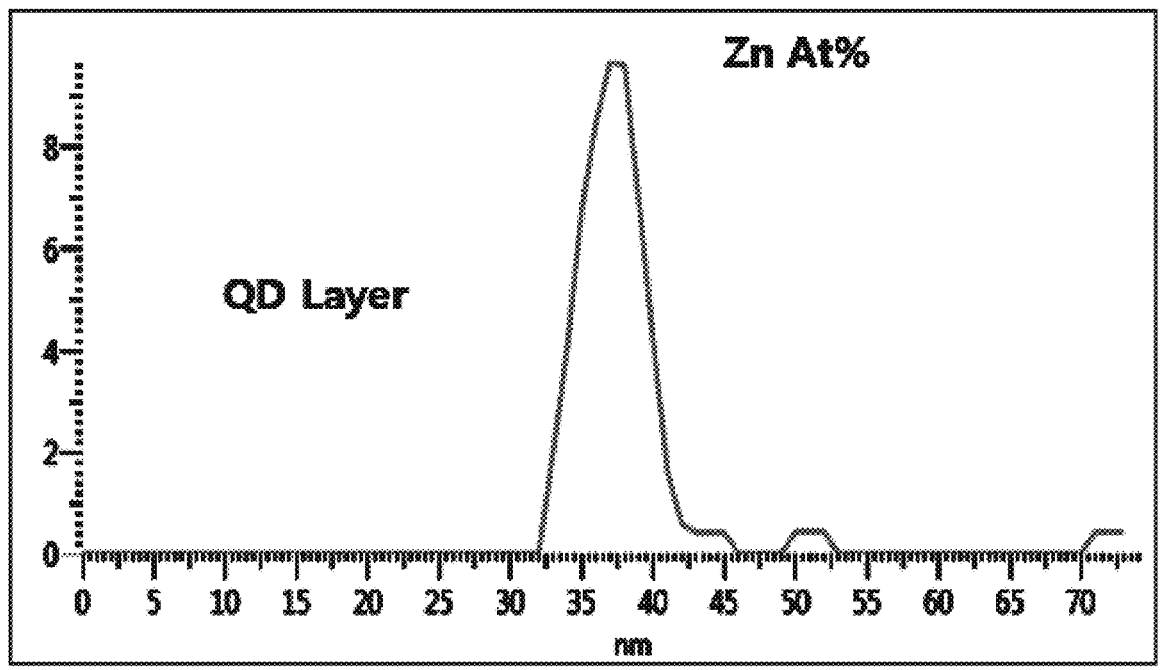
Figure 14C:
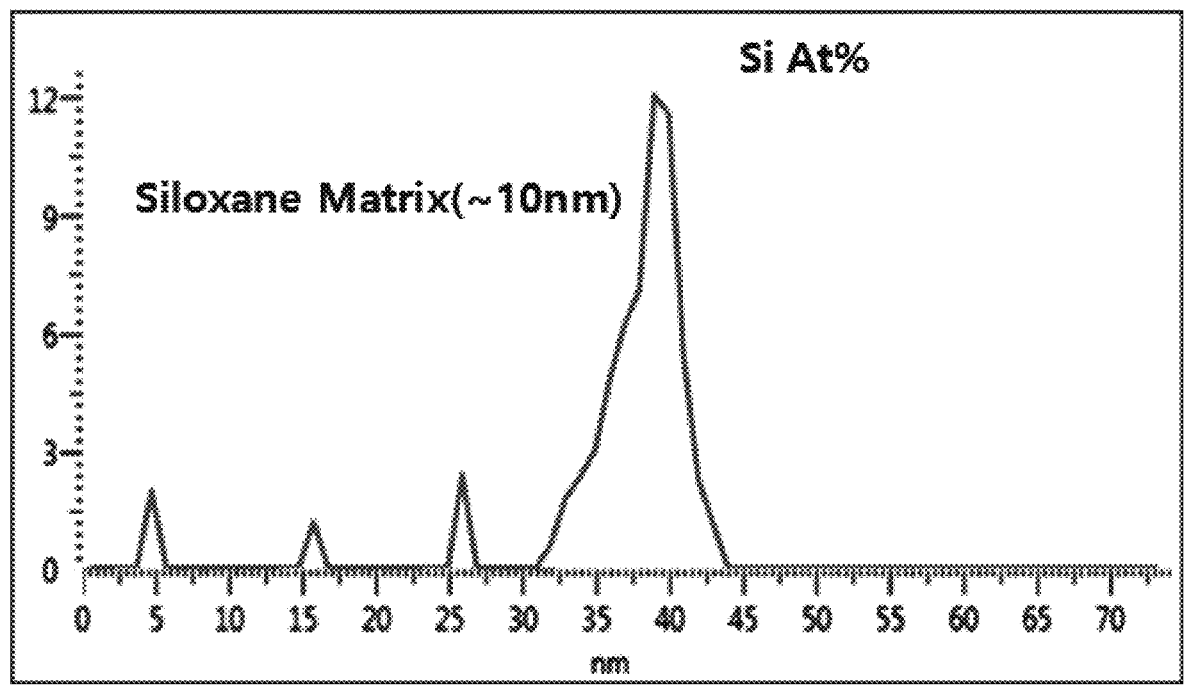

Also, as illustrated in FIGS. 14A to 14C, silicon was observed in an area corresponding to the quantum dot layer in the EML fabricated in Ex. 2, i.e., the formed siloxane matrix had the thickness substantially identical to the thickness of the quantum dot layer in the EML.

Figure 15A:
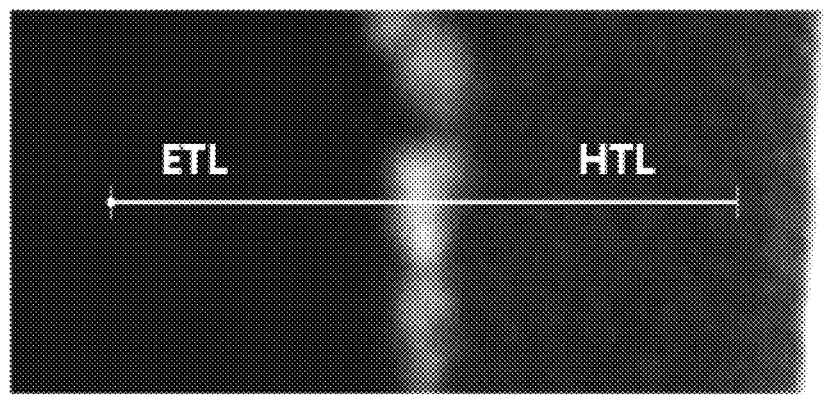
FIGS. 15A to 15C illustrate measurement results by STEM-EDS for the inorganic LED fabricated in the Comparative Example, where
Figure 15B:
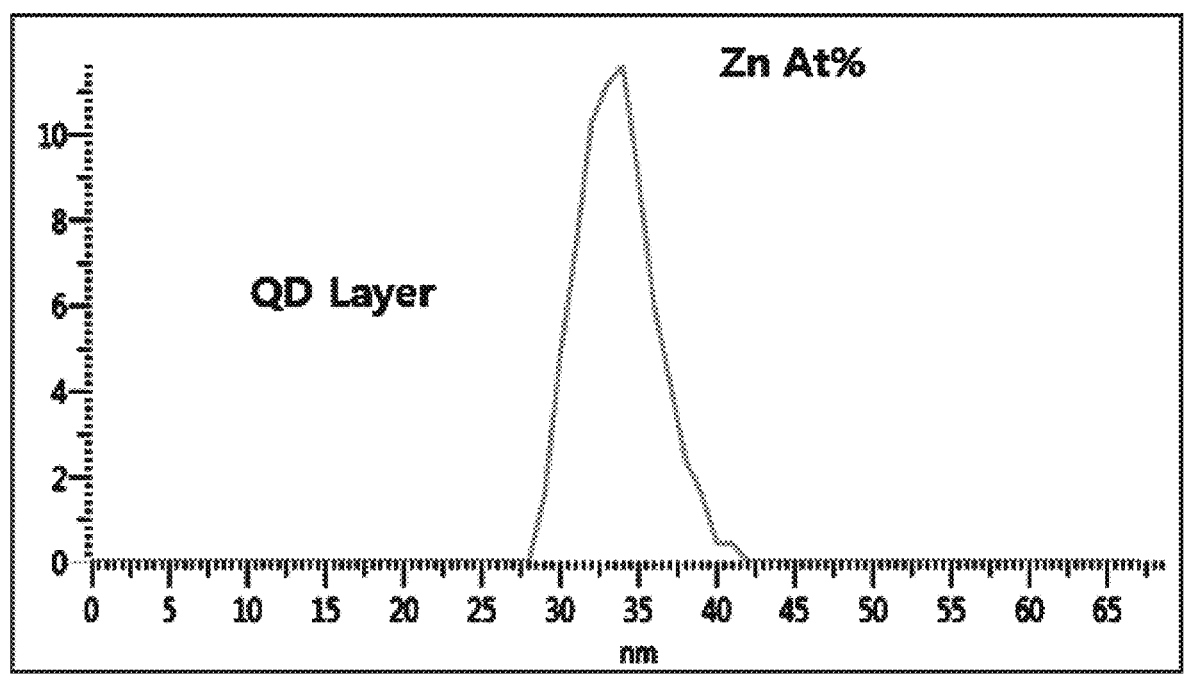
Figure 15C:
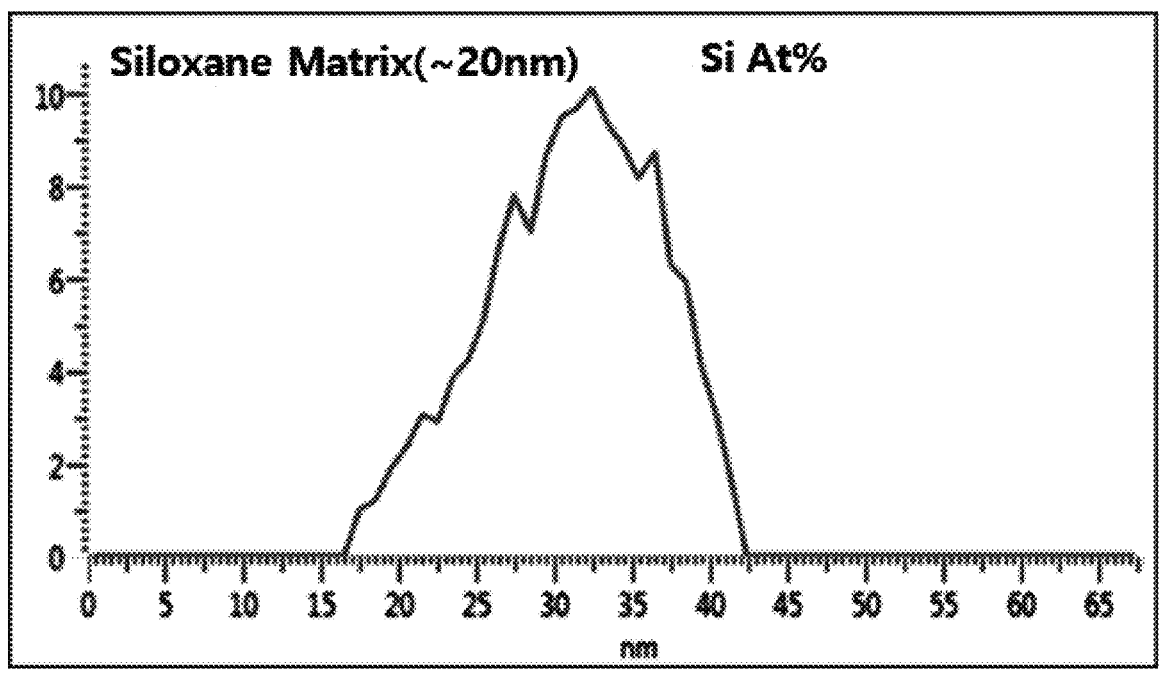

On the other hand, as illustrated in FIGS. 15A to 15C, silicon was observed to exceed the thickness of the quantum dot layer in the QLED fabricated in Ref. 1, i.e., siloxane matrix was formed over the thickness of the quantum dot layer in the EML.

Experimental Example 1: Evaluation of Luminous Properties of QLED

Each of the QLED fabricated in Ex. 1 to 2 and Ref. 1 to 2 was connected to an external power source and then luminous properties for all the diodes were evaluated using a constant current source (KEITHLEY) and a photometer PR650 at room temperature. In particular, driving voltage (V), current efficiency (cd/A), power efficiency (lm/W), external quantum efficiency (EQE, %), luminance (cd/m$^2$), color coordinates and at a current density of 10 J (mA/cm$^2$) and voltage-current density of the QLEDs were measured. The results thereof are shown in the following Table 1 and FIGS. 16 and 17.

TABLE 1

| Luminous Property of QLED | | | | | | |
| --- | --- | --- | --- | --- | --- | --- |
| Sample | V | cd/A | lm/W | EQE (%) | cd/m$^2$ | (CIEx, CIEy) |
| Ref. 1 | 6.289 | 2.050 | 1.024 | 2.235 | 205.0 | (0.667, 0.318) |
| Ref. 2 | 3.719 | 1.139 | 0.962 | 1.201 | 113.9 | (0.688, 0.310) |
| Ex. 1 | 4.126 | 4.698 | 3.577 | 4.656 | 469.8 | (0.646, 0.306) |
| Ex. 2 | 4.454 | 2.223 | 1.157 | 2.467 | 222.3 | (0.653, 0.311) |

Figure 16:
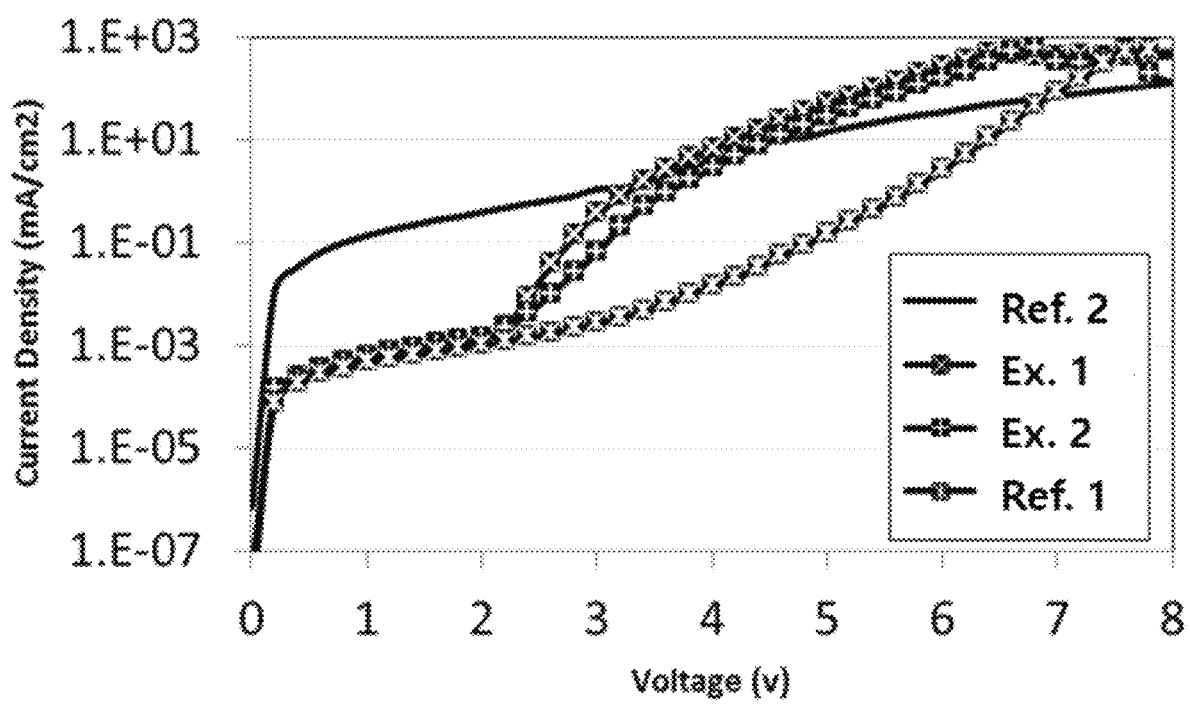
FIG. 16 is a graph illustrating measurement results of leakage current by voltage (V)—current density in LEDs fabricated in accordance with Examples of the present disclosure.
Figure 17:
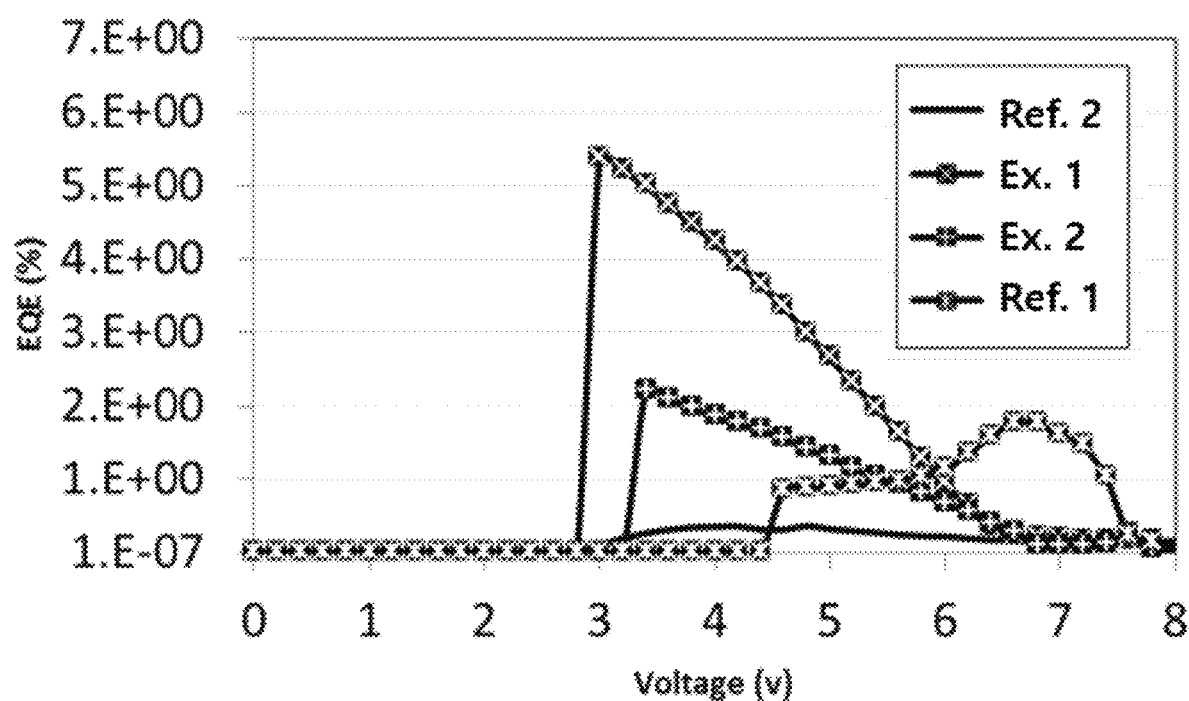
FIG. 17 is a graph illustrating measurement results of voltage (V)—external quantum efficiency (EQE) in LEDs fabricated in accordance with Examples of the present disclosure.

As indicated in Table 1 and FIG. 17, compared to the QLED in which the siloxane matrix was formed over the quantum dot layer in Ref. 1, the OLEDs in which the siloxane matrix was formed less than or equal to the quantum dot layer in Ex.1 to 2 lowered their driving voltages up to 34.4% and improved their current efficiency, power efficiency, EQE and luminance up to 128.9%, 249.3%, 108.3% and 129.2%, respectively. Also, compared to the QLED in which the EML consists of only the quantum dot in Ref. 2, the QLEDs in Ex. 1 to 2 improved their current efficiency, power efficiency, EQE and luminance up to 312.5%, 271.8%, 287.7% and 312.5%, respectively. In addition, as illustrated in FIG. 16, compared to the QLEDs fabricated in Ref. 1 to 2, the QLEDs fabricated in Ex. 1 to 2 showed much reduced leakage current.

It will be apparent to those skilled in the art that various modifications and variations can be made in the present disclosure without departing from the scope of the invention. Thus, it is intended that the present disclosure cover the modifications and variations of the present disclosure provided they come within the scope of the appended claims.

What is claimed is:

1. An inorganic light emitting diode, comprising:
a first electrode;
a second electrode facing the first electrode; and
an emitting material layer disposed between the first and second electrodes,
wherein the emitting material layer comprises plural inorganic luminescent particles dispersed in a siloxane matrix, and
wherein the siloxane matrix has a thickness less than a thickness of a layer of the inorganic luminescent particles.

2. The inorganic light emitting diode of claim 1, wherein the siloxane matrix has the thickness of at least equal to or greater than about a tenth of the thickness of the layer of the plural inorganic luminescent particles.

3. The inorganic emitting diode of claim 1, wherein the siloxane matrix has the thickness of at least equal to or greater than about a fourth of the thickness of the layer of the plural inorganic luminescent particles.

4. The inorganic emitting diode of claim 1, wherein the siloxane matrix has the thickness of at least equal to or greater than about a third of the thickness of the layer of the plural inorganic luminescent particles.

5. The inorganic light emitting diode of claim 1, wherein the plural inorganic luminescent particles and the siloxane matrix in the emitting material layer are mixed with a volume ratio between about 1:0.01 and about 1:4.

6. The inorganic light emitting diode of claim 1, wherein the plural inorganic luminescent particles and the siloxane matrix in the emitting material layer are mixed with a volume ratio between about 1:0.05 and about 1:2.

7. The inorganic light emitting diode of claim 1, wherein the siloxane matrix comprises an orthosilicate moiety.

8. The inorganic light emitting diode of claim 7, wherein the orthosilicate moiety comprises a tetramethyl orthosilicate moiety, a tetraethyl orthosilicate moiety, a tetrapropyl orthosilicate, a tetrabutyl orthosilicate, or a tetrakis (2-ethylhexyl) orthosilicate moiety.

9. The inorganic light emitting diode of claim 1, wherein the siloxane matrix comprises a silsesquioxane.

10. The inorganic light emitting diode of claim 1, wherein the plural inorganic luminescent particles include at least one of a quantum dot (QD) and a quantum rod (QR).

11. An inorganic light emitting device, comprising:
a substrate; and
the inorganic light emitting diode of claim 1 over the substrate.

12. The inorganic light emitting device of claim 11, wherein the siloxane matrix has the thickness of at least equal to or greater than about a tenth of the thickness of the layer of the plural inorganic luminescent particles.

13. The inorganic light emitting device of claim 11, wherein the siloxane matrix has the thickness of at least equal to or greater than about a fourth of the thickness of the layer of the plural inorganic luminescent particles.

14. The inorganic light emitting device of claim 11, wherein the siloxane matrix has the thickness of at least equal to or greater than about a third of the thickness of the layer of the plural inorganic luminescent particles.

15. The inorganic light emitting device of claim 11, wherein the plural inorganic luminescent particles and the siloxane matrix in the emitting material layer are mixed with a volume ratio between about 1:0.01 and about 1:4.

16. The inorganic light emitting device of claim 11, wherein the plural inorganic luminescent particles and the siloxane matrix in the emitting material layer are mixed with a volume ratio between about 1:0.05 and about 1:2.

17. The inorganic light emitting device of claim 11, wherein the siloxane matrix comprises an orthosilicate moiety.

18. The inorganic light emitting device of claim 17, wherein the orthosilicate moiety comprises a tetramethyl orthosilicate moiety, a tetraethyl orthosilicate moiety, a tetrapropyl orthosilicate, a tetrabutyl orthosilicate, or a tetrakis(2-ethylhexyl) orthosilicate moiety.

19. The inorganic light emitting device of claim 11, wherein the siloxane matrix comprises a silsesquioxane.

20. The inorganic light emitting device of claim 11, wherein the plural inorganic luminescent particles include at least one of a quantum dot (QD) and a quantum rod (QR).

* * * * *